(12) United States Patent
Liu et al.

(10) Patent No.: US 10,038,406 B2
(45) Date of Patent: Jul. 31, 2018

(54) VARIABLE SWITCHED DC-TO-DC VOLTAGE CONVERTER

(71) Applicant: Skyworks Solutions, Inc., Woburn, MA (US)

(72) Inventors: Hui Liu, Cedar Rapids, IA (US); David Steven Ripley, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/294,501

(22) Filed: Oct. 14, 2016

(65) Prior Publication Data

US 2017/0194914 A1   Jul. 6, 2017

Related U.S. Application Data

(60) Continuation of application No. 14/806,468, filed on Jul. 22, 2015, now Pat. No. 9,473,073, which is a continuation of application No. 14/489,200, filed on Sep. 17, 2014, now Pat. No. 9,106,183, which is a division of application No. 13/474,417, filed on May 17, 2012, now Pat. No. 9,136,795.

(60) Provisional application No. 61/487,857, filed on May 19, 2011.

(51) Int. Cl.
  *H03F 1/02* (2006.01)
  *H03F 3/195* (2006.01)
  *H03F 3/24* (2006.01)
  *H04W 52/02* (2009.01)

(52) U.S. Cl.
  CPC .......... *H03F 1/0238* (2013.01); *H03F 3/195* (2013.01); *H03F 3/245* (2013.01); *H04W 52/0261* (2013.01); *H03F 2200/105* (2013.01); *H03F 2200/421* (2013.01); *H03F 2200/451* (2013.01); *H03F 2200/78* (2013.01)

(58) Field of Classification Search
  CPC ...................................... H03F 1/0238
  USPC ........................................ 330/297
  See application file for complete search history.

(56) References Cited

U.S. PATENT DOCUMENTS

| 4,497,054 | A | 1/1985 | Read |
| 4,581,603 | A | 4/1986 | Ingold et al. |
| 4,719,447 | A | 1/1988 | Garuts |
| 4,983,865 | A | 1/1991 | Ho et al. |
| 5,227,781 | A | 7/1993 | Ninnis |

(Continued)

FOREIGN PATENT DOCUMENTS

| CN | 1474500 | 2/2004 |
| CN | 1909348 | 2/2007 |

(Continued)

OTHER PUBLICATIONS

Search Report and Written dated Aug. 26, 2011 for International Application No. PCT/US2010/058274, filed on Nov. 30, 2010. 8 pages.

*Primary Examiner* — Patricia T Nguyen
(74) *Attorney, Agent, or Firm* — Knobbe, Martens, Olson & Bear, LLP

(57) ABSTRACT

A voltage converter can be switched among two or more modes to produce an output voltage tracking a reference voltage that can be of an intermediate level between discrete levels corresponding to the modes. One or more voltages generated from a power supply voltage, such as a battery voltage, can be compared with the reference voltage to determine whether to adjust the mode. The reference voltage can be independent of the power supply voltage.

20 Claims, 15 Drawing Sheets

(56) References Cited

U.S. PATENT DOCUMENTS

| | | | |
|---|---|---|---|
| 6,055,168 | A | 4/2000 | Kotowski et al. |
| 6,198,645 | B1 | 3/2001 | Kotowski et al. |
| 6,226,193 | B1 | 5/2001 | Bayer et al. |
| 6,373,340 | B1 | 4/2002 | Shashoua |
| 6,531,792 | B2 | 3/2003 | Oshio |
| 6,753,623 | B2 | 6/2004 | McIntyre et al. |
| 6,903,572 | B2 | 6/2005 | Nozawa et al. |
| 7,286,069 | B1 | 10/2007 | Duewer et al. |
| 7,342,389 | B1 | 3/2008 | Wu et al. |
| 8,040,162 | B2 | 10/2011 | Miyazaki |
| 8,537,579 | B2 | 9/2013 | Ripley et al. |
| 8,704,408 | B2 | 4/2014 | Becker et al. |
| 8,749,308 | B2 | 6/2014 | Wilson |
| 8,848,947 | B2 | 9/2014 | Poulsen |
| 9,054,575 | B2 | 6/2015 | Ripley et al. |
| 9,106,183 | B2 | 8/2015 | Liu et al. |
| 9,136,795 | B2 | 9/2015 | Liu et al. |
| 9,473,019 | B2 | 10/2016 | Liu et al. |
| 9,473,073 | B2 | 10/2016 | Liu et al. |
| 2001/0038279 | A1 | 11/2001 | Jaworski |
| 2007/0052471 | A1 | 3/2007 | Ng |
| 2009/0072800 | A1 | 3/2009 | Ramadass et al. |
| 2009/0224743 | A1 | 9/2009 | Bairanzade et al. |
| 2010/0277225 | A1 | 11/2010 | Gerber |
| 2011/0128761 | A1 | 6/2011 | Ripley et al. |
| 2012/0170770 | A1 | 7/2012 | Lesso et al. |
| 2012/0293254 | A1 | 11/2012 | Liu et al. |
| 2012/0326901 | A1 | 12/2012 | Zhao |

FOREIGN PATENT DOCUMENTS

| | | |
|---|---|---|
| CN | 101478234 | 7/2009 |
| JP | 2007-336722 | 12/2007 |

| V_23 | V_12 | V_13 | V_UD | NEXT MODE | HOLD |
|---|---|---|---|---|---|
| 0 | 0 | 0 | 0 | N/A | 1 |
| 0 | 0 | 0 | 1 | 1/3 | 0 |
| 0 | 0 | 1 | 0 | 1/3 | 0 |
| 0 | 1 | 1 | 1 | 1/2A | 0 |
| 0 | 1 | 1 | 0 | 1/2B | 0 |
| 1 | 1 | 1 | 1 | 2/3 | 0 |
| 1 | 1 | 1 | 0 | 2/3 | 0 |
| 1 | 1 | 1 | 1 | Vbatt | 0 |

FIG.9

VARIABLE SWITCHED DC-TO-DC VOLTAGE CONVERTER

CROSS-REFERENCE TO RELATED APPLICATIONS

This application is a continuation of U.S. patent application Ser. No. 14/806,468, filed Jul. 22, 2015, titled "VARIABLE SWITCHED DC-TO-DC VOLTAGE CONVERTER," which is a continuation of U.S. patent application Ser. No. 14/489,200, filed Sep. 17, 2014, titled "VARIABLE SWITCHED DC-TO-DC VOLTAGE CONVERTER," which is a divisional of U.S. patent application Ser. No. 13/474,417, filed May 17, 2012, titled "VARIABLE SWITCHED DC-TO-DC VOLTAGE CONVERTER," which claims the benefit of priority under 35 U.S.C. § 119(e) of U.S. Provisional Patent Application No. 61/487,857, filed May 19, 2011, titled "VARIABLE SWITCHED DC-TO-DC VOLTAGE CONVERTER," the disclosures of each of which are hereby incorporated by reference herein in their entireties.

BACKGROUND

Technical Field

The disclosed technology relates to electronic systems and, in particular, to DC-to-DC voltage converters.

Description of Related Technology

One type of device that converts one DC voltage level to another may be referred to as a DC-to-DC converter (DC-DC converter). DC-DC converters can be included in battery-operated devices such as mobile telephones, laptop computers, etc., in which the various subsystems of the device require several discrete voltage levels. In some types of devices, such as a mobile telephone that operates in a number of different modes, it can be desirable to supply certain elements, such as power amplifiers, with a supply voltage at a more efficient level for the mode of operation, rather than waste power and accordingly drain the battery prematurely. In such devices, it can be desirable to employ a DC-DC converter that can generate a number of discrete voltage levels.

Some example DC-DC converters include switched-mode DC-DC converters and DC-DC converters that employ pulse-width modulation (PWM). Switched-mode DC-DC converters can convert one DC voltage level to another by storing the input energy momentarily in inductors and/or capacitors and then releasing that energy to the output at a different voltage. The switching circuitry can thus continuously switch between two states or phases: a first state in which a network of inductors and/or capacitors is charging, and a second state in which the network is discharging. The switching circuitry can generate an output voltage that is a fixed fraction of the battery voltage, such as one-third, one-half, two-thirds, etc., where a mode selection signal can be provided as an input to the switching circuitry to control which of the fixed fractions is to be employed. Different configurations of the network of inductors and/or capacitors can be selected by manipulating switches in the network based on the mode selection signal.

The number of discrete output voltages that a switched-mode DC-DC converter can generate can be related to the number of inductors and/or capacitors in the switching circuitry. In a portable, handheld device such as a mobile telephone it can be desirable to minimize size and weight. A DC-DC converter having a relatively large number of inductors and/or capacitors may not be conducive to minimizing the size and weight of a mobile telephone. A PWM-based DC-DC converter can generate a larger number of discrete voltages than a switched-mode DC-DC converter without employing significantly more inductors, capacitors and/or other circuit elements. However, a PWM based DC-DC converter can generate a relatively large spectrum of spurious output signals that can adversely affect the operation of a mobile telephone or other frequency-sensitive device. Filters having relatively large capacitances and/or inductances can be included in a PWM-based DC-DC converter to minimize these spurious signals, but large filter capacitors and/or inductors can be undesirable, for example, as described above.

SUMMARY OF CERTAIN INVENTIVE ASPECTS

The apparatus and methods described in the claims each have several aspects, no single one of which is solely responsible for its desirable attributes. Without limiting the scope of this disclosure, some prominent features will now be briefly discussed.

One aspect of this disclosure is an apparatus that includes a switch matrix and control logic. The switch matrix includes switches configurable into a plurality of states corresponding to a plurality of voltage levels of an output voltage. The switch matrix is configured to adjust a state of at least one of switches based at least in part on one or more mode control signals. The control logic has a first input coupled to a first voltage generated from a voltage supply and a second input coupled to a reference voltage independent of the voltage supply. The control logic is configured to compare the first voltage generated from the voltage supply with the reference voltage independent of the voltage supply. The control logic is configured to generate the one or more mode control signals based at least in part on the comparison.

The apparatus can also include a plurality of capacitive circuit elements operatively coupled to the switch matrix. The switch matrix can be configured to adjust electrical connections between the capacitive circuit elements and an output node. Two or more of the switches in the switch matrix can be controlled by different mode control signals. The switch matrix can also be configured to implement a plurality of modes, each mode having a first phase configuration in which at least one of the plurality of capacitive circuit element is charged and a second phase configuration in which the at least one of the plurality of capacitive circuit element is discharged.

The control logic can also be configured to compare the reference voltage to a second reference voltage generated from the power supply, in which the second reference voltage generated from the power supply has a different potential difference than the first voltage generated from the power supply. The one or more mode control signals can be generated based on comparing the reference voltage to the second reference voltage generated from the power supply. The control logic can also be configured to compare the reference voltage to a third voltage generated from the power supply, in which the third reference voltage generated from the power supply has a different potential difference than the first voltage generated from the power supply and the second voltage generated from the power supply. The one or more mode control signals can be generated based on comparing the reference voltage to the third voltage generated from the power supply. The control logic can be programmable between continuous and discrete voltage modes.

The output voltage may not be filtered by an inductor of an LC filter.

The reference voltage can track an output power of a power amplifier. The apparatus can also include a bypass capacitor having a first end coupled to the reference voltage and a second end coupled to analog ground.

Noise on the second reference voltage can be at least about an order of magnitude less than noise on the output voltage.

Another aspect of the disclosure is a multi-chip module that includes a power amplifier die including one or more power amplifiers and a controller die. The controller die includes a power amplifier bias control and a direct current to direct current (DC-DC) converter. The DC-DC converter is configured to generate an output voltage based on one or more mode control signals. The DC-DC converter has mode control logic configured to compare a plurality of voltages generated from a voltage supply to a reference voltage independent of the voltage supply and to generate the one or more mode control signals based at least in part on the comparisons.

The power amplifier die can include a GaAs device and the controller die can include a CMOS device. The power amplifier can include a CDMA power amplifier, such as a dual-band CDMA power amplifier or a tri-band CDMA power amplifier. The multi-chip module can be configured to be mounted on a phone board.

Another aspect of this disclosure is a mobile device that includes a battery, a power amplifier, and a direct current to direct current (DC-DC) voltage converter. The battery is configured to power the mobile device. The power amplifier is configured to amplify a radio frequency (RF) input signal and to generate an amplified RF output signal. The DC-DC voltage converter is configured to generate an output voltage to control the power amplifier so as to improve power efficiency. The DC-DC voltage converter includes a switch matrix having a plurality of mode configurations corresponding to a plurality of output voltage levels. The switch matrix is configured to adjust a state of one or more switches based at least in part on one or more mode control signals. The DC-DC voltage converter also includes control logic configured to compare a first voltage generated from the battery to a reference voltage indicative of an output power of the power amplifier, and to generate the one or more mode control signals based at least in part on the comparison.

The DC-DC voltage converter can be configured to transition into pulse skipping mode based at least in part on the comparison.

At least one of the one or more switches can have a plurality of sub-switches, and at least one of the plurality of sub-switches can be configured to change a state based at least in part on an amount of current provided by the DC-DC voltage converter.

The mobile device can be configured to communication using, for example, a 3G communications standard or a 4G communications standard. The mobile device can be configured, for example, as a smart phone or a tablet computer.

Another aspect of this disclosure is an apparatus that includes a switch matrix and control logic. The switch matrix includes switches configurable into a plurality of states corresponding to a plurality of voltage levels of an output voltage. The switch matrix is configured to adjust a state of the plurality of states based at least in part on a mode control signal. The control logic has a first input coupled to a voltage generated from a voltage supply and a second input coupled to a low noise voltage having noise features causing a distortion with a magnitude of no more than about 0.1% of a magnitude of the low noise signal voltage. The control logic is configured to compare the voltage generated from the voltage supply with the low noise voltage and to generate the one or more mode control signals based at least in part on the comparison.

The low noise voltage can have noise that is one or two orders of magnitude less than the output voltage. The low noise voltage can have noise features causing a distortion with a magnitude of no more than about 0.05% of a magnitude of the low noise signal voltage Yet another aspect of this disclosure is a method that includes: comparing a first voltage generated from a voltage supply with a reference voltage independent of the voltage supply; generating a mode control signal based at least in part on the comparing; and adjusting a state of at least one switch in a switch matrix based on the mode control signal to adjust a voltage level of an output of the switch matrix.

The method can also include additionally comparing a voltage indicative of the output of the switch matrix with the reference voltage, and generating the mode control signal can also be based on the additionally comparing.

The method can also include additionally comparing the reference voltage independent of the voltage supply with a second voltage generated from the voltage supply and having a different voltage level than the first voltage generated from the voltage supply, and generating the mode control signal can also be based on the additionally comparing.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 9 is a truth table associated with example mode selection logic of FIG. 3A and FIG. 3B.

DETAILED DESCRIPTION OF CERTAIN EMBODIMENTS

Figure 1:
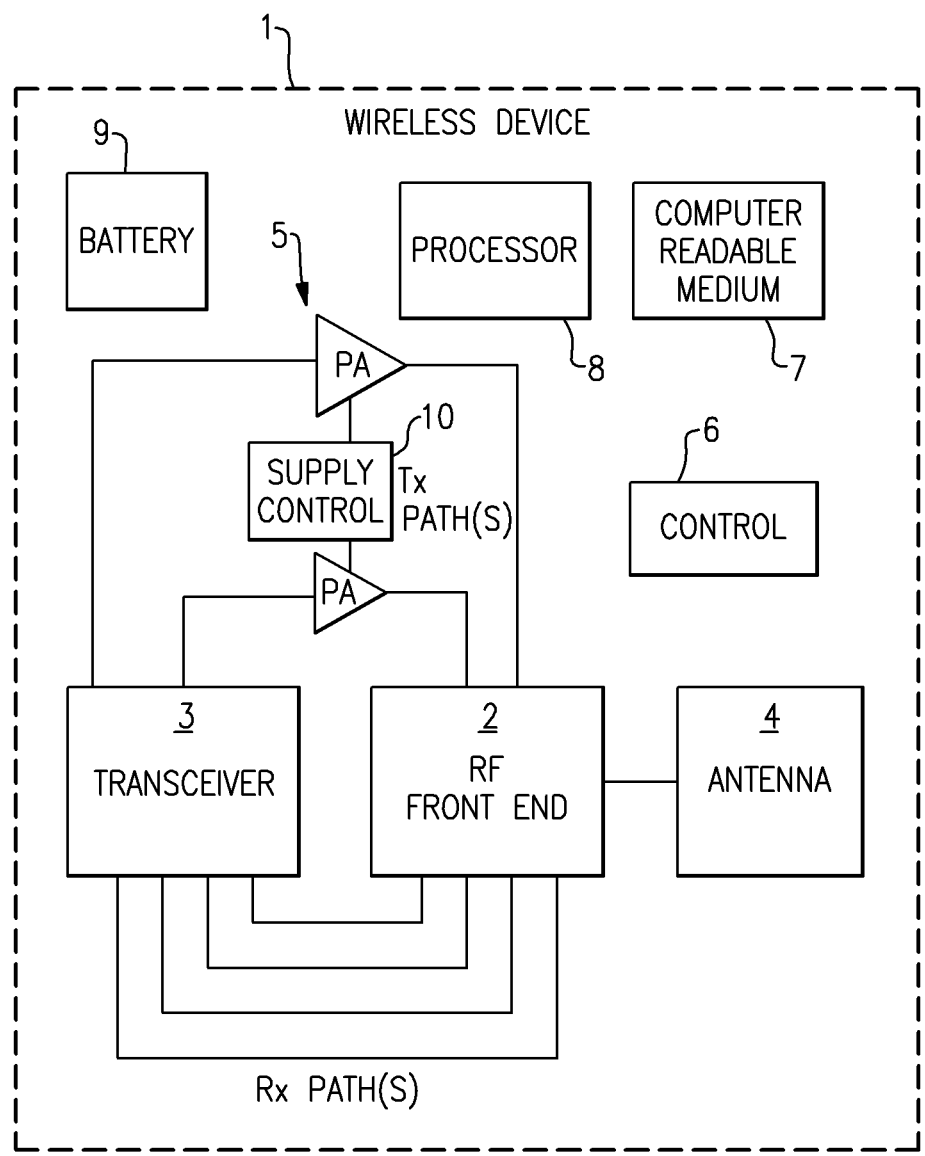
FIG. 1 is a schematic block diagram of an illustrative wireless device.

Generally described, aspects of the present disclosure relate to DC-DC voltage conversion. More specifically, some implementations relate to variable switched capacitor DC-DC converters. Using the voltage conversion systems, apparatus, and methods described herein, electronic systems, such as power amplifier systems, can operate more efficiently and/or consume less power. For instance, power amplifier biasing can be made more efficient. A switched capacitor architecture can utilize feedback to dynamically select switch mode and generate a control voltage. Switch sizes and/or switching frequency can be dynamically adjusted.

DC-DC converters that use pulse width modulation (PWM) architectures can generate undesirable output spectrum including noise. In such PWM architectures, the output noise spectrum may require an LC filter that includes a large inductive element that is expensive to implement and can radiate energy. Switched capacitor architectures can remove the need for LC filters that include large inductive elements. However, some switched capacitor architectures may be configured to generate discrete voltage levels that are a function of an input supply voltage and a capacitor division ratio.

Advantageously, a switched DC-DC capacitor architecture can use feedback to dynamically select a division ratio of a voltage converter by toggling between various output states. As a result, an intermediate voltage can be generated over a continuous range between a lowest division mode and a highest division mode.

The methods, systems, and apparatus for voltage conversion described herein may be able to achieve one or more of the following advantageous features, among others. An output noise spectrum can be reduced compared to conventional PWM architectures. The switched capacitor architecture can be modeled as an RC filter with a corner frequency related to a switching frequency and capacitors. Low pass characteristics of the filter can allow for elimination of the conventionally large inductors used in an LC filter network and/or support integration into a small package foot print or co-integration with power amplifier products.

The use of feedback described herein can further reduce the noise spectrum on an output of a voltage converter. The feedback can also improve the tolerance of a voltage converter to noise and/or jitter on the output of the voltage regulator.

The switch control methods described herein can use comparator circuits to optimize effective switch size based on reference voltage and/or power amplifier output power levels. Alternatively or additionally, the comparator circuits can be used to optimize switching frequency based on reference voltage and/or power amplifier output power levels.

One or more outputs of the comparator circuit can be used to optimize a bias current based on different reference voltage. The bias profile can also track the reference voltage like a power amplifier collector voltage.

The feedback methods and methods to adjust switch size, switching frequency, and power amplifier biasing according to an input reference voltage can make the power amplifier more efficient. This can lead to reduced power consumption and extended battery life in systems powered by a battery.

The headings provided herein are for convenience only and do not necessarily affect the scope or meaning of the claimed invention.

Overview of Wireless Devices

Any of the methods, apparatus, and computer-readable media for DC-DC voltage conversion described herein can be implemented in a variety of electronic devices, such as a wireless device, which can also be referred to as a mobile device. FIG. 1 schematically depicts a wireless device 1. Examples of the wireless device 1 include, but are not limited to, a cellular phone (e.g., a smart phone), a laptop, a tablet computer, a personal digital assistant (PDA), an electronic book reader, and a portable digital media player. For instance, the wireless device 1 can be a multi-band and/or multi-mode device such as a multi-band/multi-mode mobile phone configured to communicate using, for example, Global System for Mobile (GSM), code division multiple access (CDMA), 3G, 4G, and/or long term evolution (LTE).

In certain embodiments, the wireless device 1 can include one or more of a RF front end 2, a transceiver component 3, an antenna 4, power amplifiers 5, a control component 6, a computer readable medium 7, a processor 8, a battery 9, and supply control block 10.

The transceiver component 3 can generate RF signals for transmission via the antenna 4. Furthermore, the transceiver component 3 can receive incoming RF signals from the antenna 4.

It will be understood that various functionalities associated with the transmission and receiving of RF signals can be achieved by one or more components that are collectively represented in FIG. 1 as the transceiver 3. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 1 as the antenna 4. For example, a single antenna can be configured to provide both transmitting and receiving functionalities. In another example, transmitting and receiving functionalities can be provided by separate antennas. In yet another example, different bands associated with the wireless device 1 can be provided with different antennas.

In FIG. 1, one or more output signals from the transceiver 3 are depicted as being provided to the antenna 4 via one or more transmission paths. In the example shown, different transmission paths can represent output paths associated with different bands and/or different power outputs. For instance, the two example power amplifiers 5 shown can represent amplifications associated with different power output configurations (e.g., low power output and high power output), and/or amplifications associated with different bands.

In FIG. 1, one or more detected signals from the antenna 4 are depicted as being provided to the transceiver 3 via one or more receiving paths. In the example shown, different receiving paths can represent paths associated with different bands. For example, the four example paths shown can represent quad-band capability that some wireless devices are provided with.

To facilitate switching between receive and transmit paths, the RF front end 2 can be configured to electrically connect the antenna 4 to a selected transmit or receive path. Thus, the RF front end 2 can provide a number of switching functionalities associated with an operation of the wireless device 1. In certain embodiments, the RF front end 2 can include a number of switches configured to provide functionalities associated with, for example, switching between different bands, switching between different power modes, switching between transmission and receiving modes, or some combination thereof. The RF front end 2 can also be configured to provide additional functionality, including filtering of signals. For example, the RF front end can include one or more duplexers.

The wireless device 1 can include one or more power amplifiers 5. RF power amplifiers can be used to boost the power of a RF signal having a relatively low power. Thereafter, the boosted RF signal can be used for a variety of purposes, included driving the antenna of a transmitter. Power amplifiers 5 can be included in electronic devices, such as mobile phones, to amplify a RF signal for transmission. For example, in mobile phones having a an architecture for communicating under the 3G and/or 4G communications standards, a power amplifier can be used to amplify a RF signal. It can be desirable to manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot. A power amplifier module can include one or more power amplifiers.

FIG. 1 shows that in certain embodiments, a control component 6 can be provided, and such a component can be configured to provide various control functionalities associated with operations of the RF front end 2, the power amplifiers 5, the supply control 10, and/or other operating component(s). Non-limiting examples of the supply control 10 are described herein in greater detail.

In certain embodiments, a processor 8 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 7 that can direct a computer or other programmable data processing apparatus to operate in a particular manner, such that the instructions stored in the computer-readable memory produce an article of manufacture including instructions which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide operations for implementing the acts specified in the flowchart and/or block diagram block or blocks.

The illustrated wireless device 1 also includes the supply control block 10, which can be used to provide a power supply to one or more of the power amplifiers 5. For example, the supply control block 10 can be a DC-to-DC converter. However, in certain embodiments the supply control block 10 can include other blocks, such as, for example, an envelope tracker configured to vary the supply voltage provided to the power amplifiers 5 based upon an envelope of the RF signal to be amplified.

The supply control block 10 can be electrically connected to the battery 9, and the supply control block 10 can be configured to vary the voltage provided to the power amplifiers 5 based on an output voltage of a DC-DC converter. The battery 9 can be any suitable battery for use in the wireless device 1, including, for example, a lithium-ion battery. By varying the voltage provided to the power amplifiers, the power consumption of the battery 9 can be reduced, thereby improving performance of the wireless device 1.

Overview of Multi-Chip Module

Figure 2:
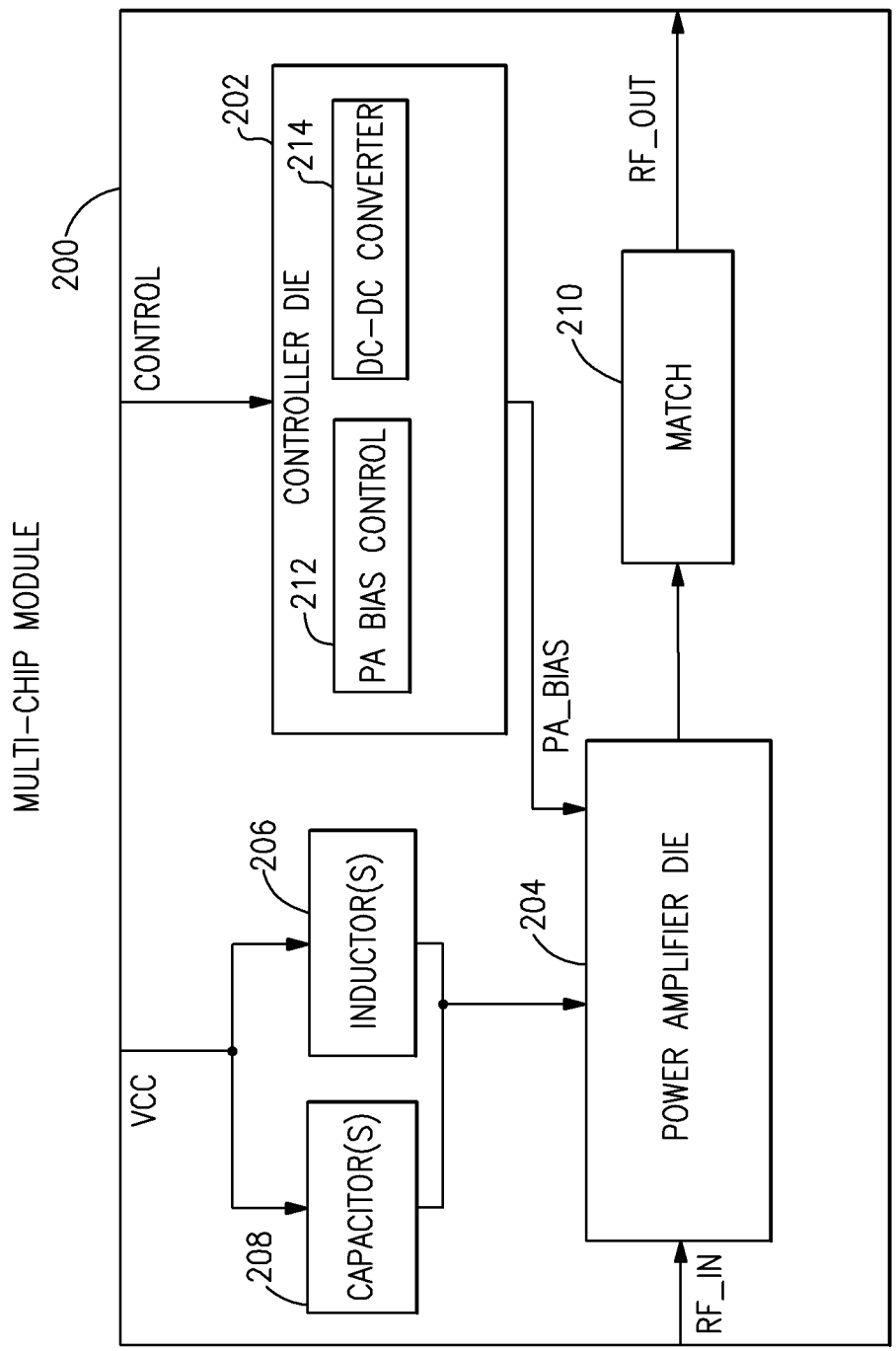
FIG. 2 is a schematic block diagram of an illustrative multi-chip module.

FIG. 2 is a schematic block diagram of a power amplifier module. The illustrated power amplifier module is a multi-chip module (MCM) 200 that can include one or more of a controller die 202, a power amplifier die 204, inductor(s) 206, capacitor(s) 208, and an impedance matching component 210. The multi-chip module 200 can include a plurality of dies and/or other components mounted on a carrier substrate of the module. In some implementations, the substrate can be a multi-layer substrate configured to support the dies and/or components and to provide electrical connectivity to external circuitry when the module is mounted on a circuit board, such as a phone board.

The power amplifier die 204 can receive a RF signal on an input pin $RF_{IN}$ of the multi-chip module. The power amplifier die 204 can include one or more power amplifiers 5, including, for example, multi-stage power amplifiers configured to amplify the RF signal. The amplified RF signal can be provided to an output pin $RF_{OUT}$ of the power amplifier module. The impedance matching component 210 can be provided on the power amplifier module to aid in reducing signal reflections and/or other signal distortions. The power amplifier die 204 can be any suitable die. In some implementations, the power amplifier die 204 is a gallium arsenide (GaAs) die. In some of these implementations, the GaAs die has transistors formed using a heterojunction bipolar transistor (HBT) process.

The multi-chip module 200 can also include a $V_{CC}$ pin, which can be electrically connected to a controller. The multi-chip module 200 can include the inductor(s) 206, which can be formed, for example, by trace on the multi-chip module 200. The inductor(s) 206 can operate as a choke inductor, and can be disposed between the supply voltage and the power amplifier die 204. In some implementations, the inductor(s) 206 are surface mounted. Additionally, capacitor(s) 208 can be electrically connected in parallel with the inductor(s) 208 and can be configured to resonate at a frequency near the frequency of a signal received on the pin $RF_{IN}$. In some implementations, the capacitor(s) 208 include a surface mounted capacitor.

In some implementations, the controller die 202 can be manufactured on a silicon wafer. In some of these implementations, the controller die 202 can be manufactured using complementary metal oxide semiconductor (CMOS) process technology. The controller die 202 can include a power amplifier bias control block 212 and/or a DC-DC converter block 214. The power amplifier bias control block 212 can be used, for example, to provide bias signals to the power amplifier die 204. For example, in a bipolar transistor power amplifier configuration, the controller die 202 can be used to provide a reference voltage for biasing a current mirror used to generate a base current for the power amplifiers 5, such as a base current for a bipolar transistor. The controller die 202 can also be used to enable and/or disable a power amplifier 5 disposed on the power amplifier die 204, which can aid in selectively activating a power amplifier 5 associated with a particular transmission path. For example, the controller die 202 can receive a control signal on a pin CONTROL, and can use the control signal to vary the bias signal provided to the power amplifier die 204 so as to selectively enable or disable the power amplifier 5. The controller die 202 can also include a DC-DC converter 214, as will be described in more detail herein.

The multi-chip module 200 can be modified to include more or fewer components, including, for example, additional power amplifier dies, capacitors and/or inductors. For instance, the multi-chip module 200 can include an additional power amplifier die, as well as an additional capacitor and inductor configured to operate as a parallel LC circuit disposed between the additional power amplifier die and the $V_{CC}$ pin of the module. The multi-chip module 200 can be configured to have additional pins, such as in implementations in which a separate power supply is provided to an input stage disposed on the power amplifier die 204 and/or implementations in which the multi-chip module 200 operates over a plurality of bands.

DC-DC Voltage Conversion

Figure 3A:
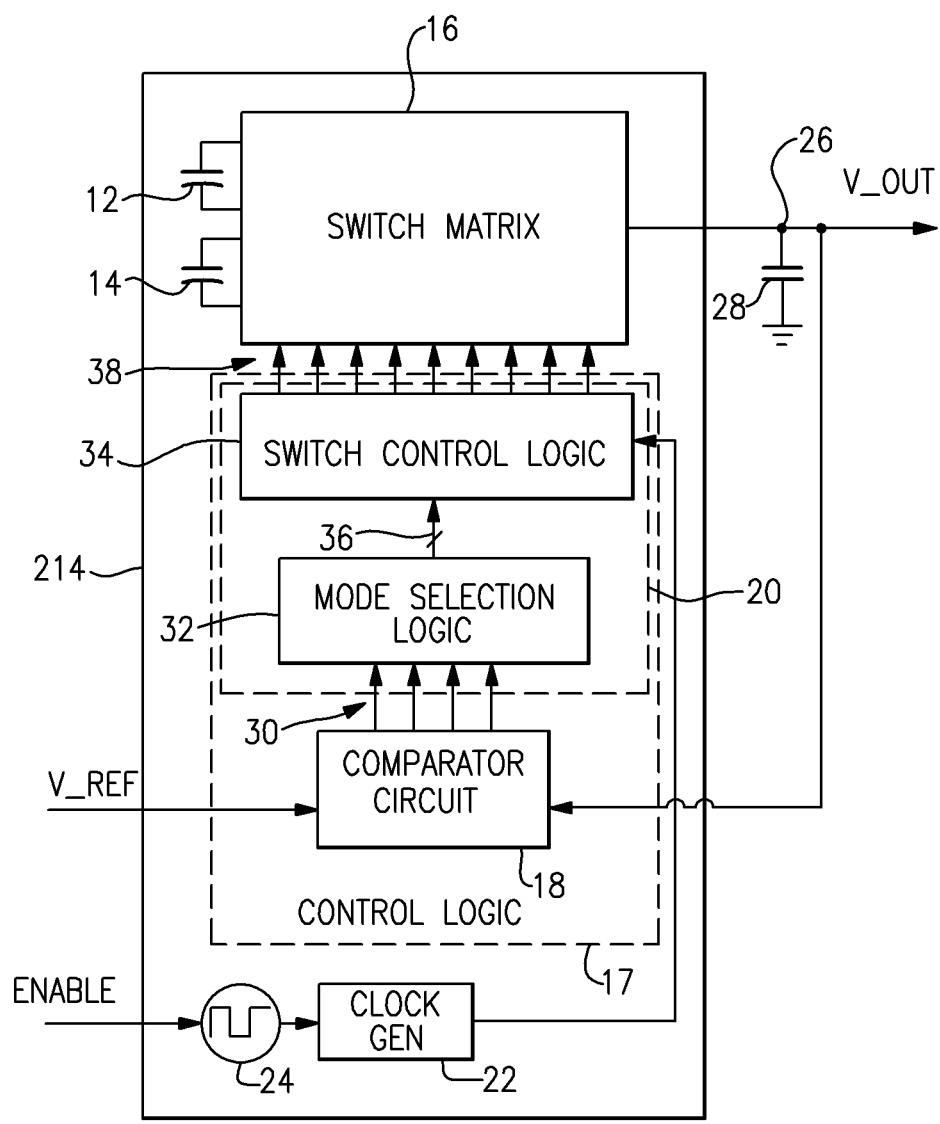
FIGS. 3A and 3B are schematic block diagrams of voltage converters according to certain embodiments.

As illustrated in FIG. 3A, in an illustrative embodiment, a DC-DC voltage converter 214 can include two capacitors 12 and 14, a switch matrix 16, and control logic 17. The control logic 17 can include any suitable circuit elements configured to adjust states of the switch matrix 16. The control logic 17 can include a comparator circuit 18 and switching logic 20. A reference voltage signal V_REF can be provided to the DC-DC voltage converter 214 as a control input. In certain embodiments, the reference voltage signal V_REF can be generated by a digital-to-analog converter (DAC) that is external to the DC-DC converter 214. Such a DAC can control an output of the DC-DC converter 214 for continuous power amplifier power adjustment. According to some embodiments, the reference voltage V_REF can be bypassed by a relative large capacitor (for example, having a capacitance on the order of 1000 pF) to analog ground. Such a bypass capacitor can have a first end electrically coupled to the reference voltage V_REF provided to an input to the DC-DC converter 214, and the bypass capacitor can have a second end coupled to analog ground. As a result, the reference voltage V_REF can be a relatively noise-free signal. The DC-DC voltage converter 214 can produce an output voltage signal V_OUT that can correspond to and/or track the reference voltage signal V_REF. In some implementations, the output voltage signal V_OUT can be provided to a collector of a bipolar transistor in a power amplifier 5. The DC-DC voltage converter 214 can further include a clock signal generator circuit 22 and associated oscillator 24 that can be activated by an enable signal ENABLE. The enable signal can remain active during the operation.

The switch matrix 16 is configurable into one of several mode configurations, for example, as described below, in which the capacitors 12 and 14 are interconnected in different configurations. Each mode configuration can be referred to as a state of the switch matrix 16. In each mode configuration, switch matrix 16 can assume either a first phase configuration, in which the capacitor circuit including the interconnected capacitors 12 and 14 is charging, or a second phase configuration, in which the capacitor circuit including the interconnected capacitors 12 and 14 is discharging. The switch matrix 16 can provide the output of the capacitor circuit at an output node 26. In operation, the switch matrix 16 can alternately switch between the first and second phase configurations in response to the clock signal generated by the clock signal generator 22. Filter circuitry, such as a capacitor 28, can be connected to output node 26 to filter the output voltage signal V_OUT.

As described in further detail below, comparator circuit 18 can compare the reference voltage signal V_REF with one or more other reference signals generated by a power supply that can be independent of the reference voltage signal V_REF. In response to one or more of these comparisons, the comparator circuit 18 can generate a number of comparison signals 30. The switching logic 20 can include mode selection logic 32 and switch control logic 34. The mode selection logic 32 can receive the comparison signals 30 and, in response, generate one or more mode selection signals 36. The switch control logic 34 can receive mode selection signals 36 and, in response, generate one or more switch control signals 38.

Figure 3B:
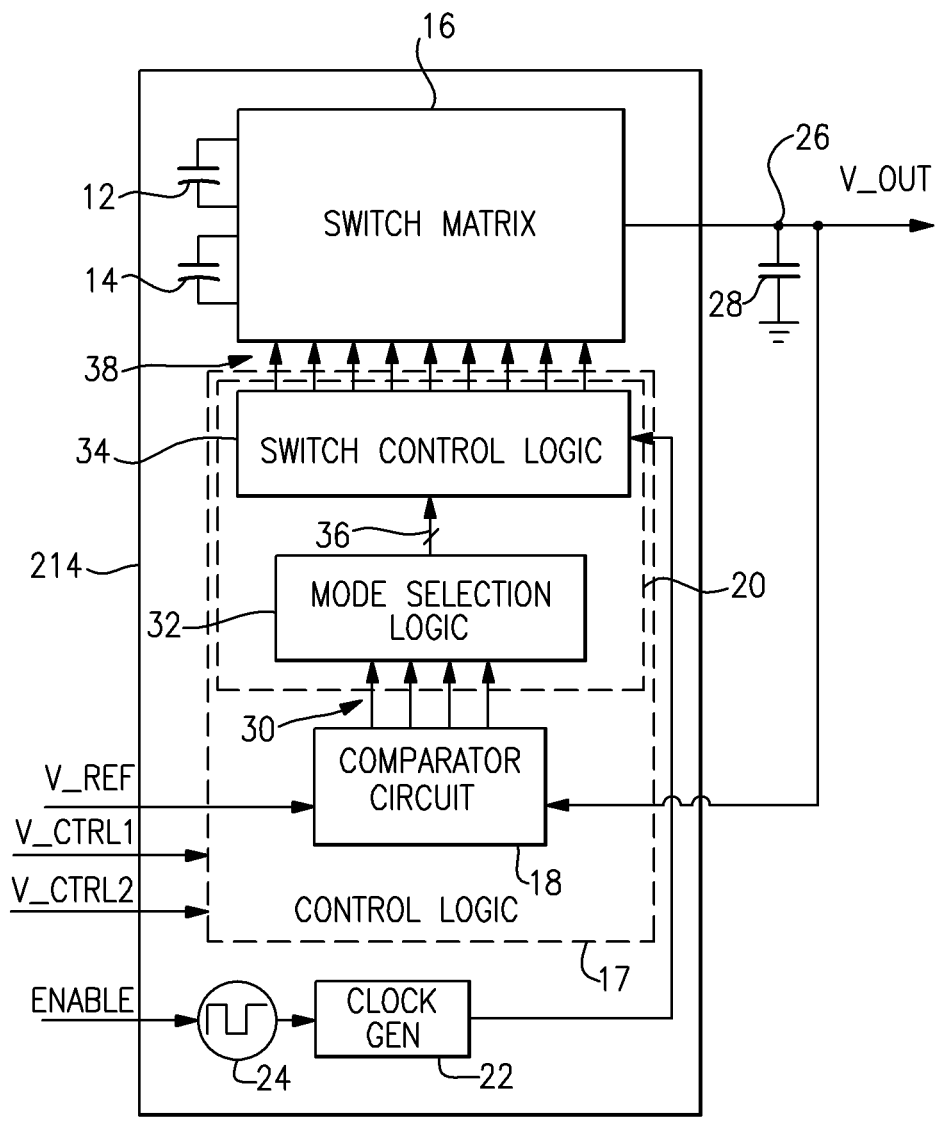

FIG. 3B shows another illustrative DC-DC converter 214. The DC-DC converter of FIG. 3B is substantially the same as the DC-DC converter of FIG. 3A, except that the DC-DC converter of FIG. 3B receives additional input signal(s) that can be used to program the DC-DC converter of FIG. 3B to operate in either step mode(s) or continuous mode(s). Thus, the DC-DC converter of FIG. 3B can be programmable between step modes and continuous mode. For example, providing one or more control signals, such as V_CTRL1 and/or V_CTRL2, to the control logic 17, can generate an output voltage V_OUT that can either be a continuous output voltage or one of a plurality of discrete output voltages. More specifically, with two digital bits V_CTRL1, V_CTRL2 and a reference voltage V_REF, the DC-DC converter 214 can either produce the continuous output or use two control bits control V_CTRL1, V_CTRL2 to generate 4 discrete output voltages. The control bits V_CTRL1, V_CTRL2 can be baseband inputs. The control bits can drive an analog signal or two or more digital signals. The control bits can, for example, clock gate circuitry related to the reference voltage V_REF. In some implementations, the DC-DC converter 214 may be able to generate both continuous and discrete voltages concurrently.

As illustrated in FIGS. 4A, 4B, 5A, 5B, 6A, 6B, 7A and 7B, the switch matrix 16 can interconnect capacitors 12 and 14 in several different configurations between a voltage potential (e.g., either a supply voltage, such as the battery voltage, or ground) and the output node 26. The illustrative switch matrix 16 includes nine switches 40, 42, 44, 46, 48, 50, 52, 54 and 56, which are controlled by the switch control signals 38 (S1-S9). Although switches 40-56 are shown schematically in FIGS. 4A-7B in the form of controllable, single-pole, single-throw (SPST) switches, they can include any suitable switching devices, such as field-effect transistors (FETs). For example, in some implementations, each of switches 40 and 50 can include a P-type FET (PFET), each of switches 46 and 56 can include an N-type FET (NFET), and each of switches 42, 44, 48, 52 and 54 can include a parallel combination of a PFET and an NFET. The control terminal (e.g., gate) of each FET can receive one of the switch control signals 38 (S1-S9).

Although the switch matrix 16 includes nine switches in the example embodiment, which can be arranged as shown, in other embodiments, a switch matrix can include any suitable number of switches arranged in any other suitable manner. Similarly, although the illustrative embodiment includes two capacitors 12 and 14, which the switch matrix 16 can interconnect as described below, other embodiments can include more than two capacitors, and a switch matrix can interconnect them in any other suitable configurations. Furthermore, applying the principles and advantages described herein, any suitable number of modes can be implemented using a switch matrix. In addition, although a battery voltage is described, another power supply voltage can be alternatively used.

Figure 4A:
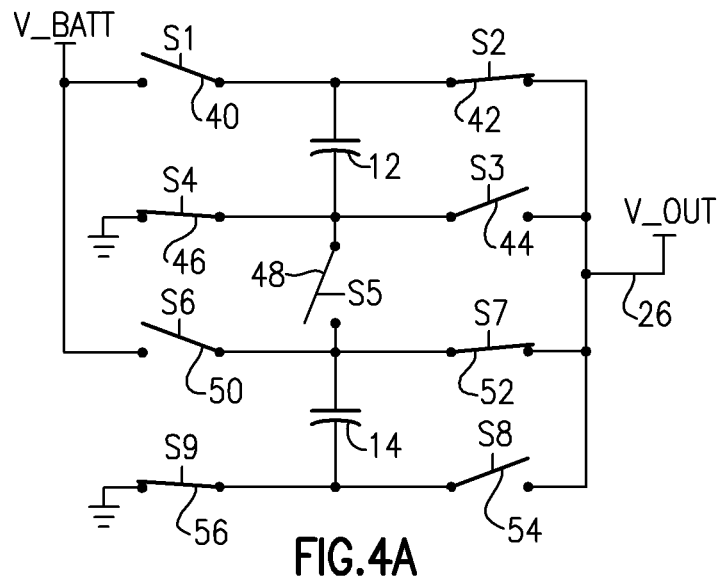
FIG. 4A is a circuit diagram illustrating an example switch matrix of FIG. 3A and FIG. 3B in a first phase configuration of a first mode configuration.
Figure 4B:
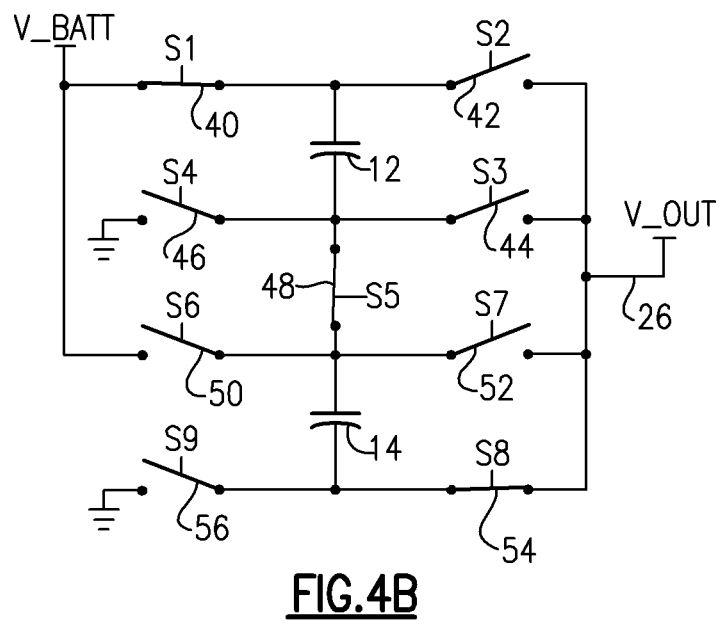
FIG. 4B is a circuit diagram illustrating the example switch matrix of FIG. 3A and FIG. 3B in a second phase configuration of the first mode configuration.

As illustrated in FIGS. 4A-B, in a first configuration, the switch matrix 16 can interconnect the capacitors 12 and 14 in either the first phase configuration shown in FIG. 4A or the second phase configuration shown in FIG. 4B. This first configuration can be referred to herein as the "⅓ mode" because operation in this mode is intended to result in an output voltage signal V_OUT at output node 26 having a voltage level that is nominally or on average about one-third of the battery voltage V_BATT, according to some implementations.

As shown in FIG. 4A, in the first phase configuration of the ⅓ mode, the switches 40, 44, 48, 50 and 54 are open, and the switches 42, 46, 52 and 56 are closed. The combination of the closed states of switches 42 and 46 couples capacitor 12 between a ground voltage potential (0 volts) and the output node 26. The combination of the closed states of switches 52 and 56 similarly couples capacitor 14 between the ground potential and output node 26 (i.e., in parallel with capacitor 12). Thus, in the first phase configuration of the ⅓ mode, the capacitor circuit including capacitors 12 and 14 in parallel with each other discharges with respect to output node 26.

As shown in FIG. 4B, in the second phase configuration of the ⅓ mode, the switches 42, 44, 46, 50, 52 and 56 are open, and the switches 40, 48 and 54 are closed. The combination of the closed states of switches 40, 48 and 54 couples capacitors 12 and 14 in series between a positive voltage potential, such as a base reference voltage provided by a battery V_BATT or other voltage supply, and output node 26. Thus, in the second phase configuration of the ⅓ mode, the capacitor circuit including capacitors 12 and 14 in series with each other charges with respect to output node 26.

Figure 5A:
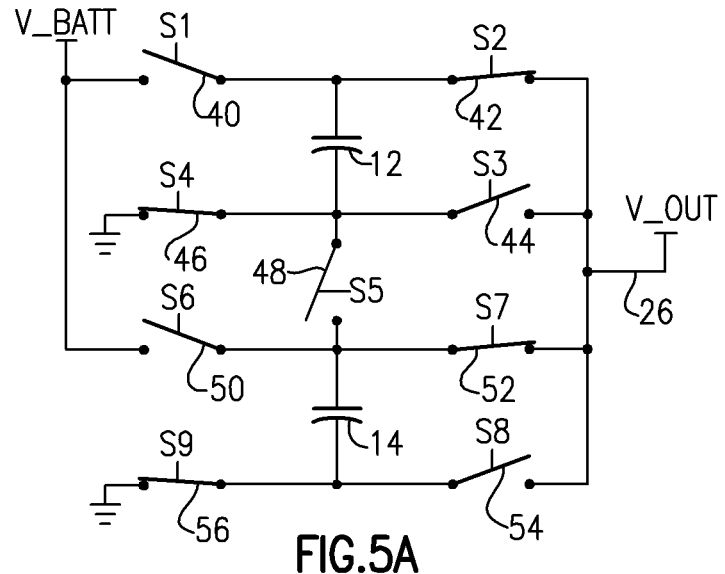
FIG. 5A is a circuit diagram illustrating the example switch matrix of FIG. 3A and FIG. 3B in a first phase configuration of a second mode configuration.
Figure 5B:
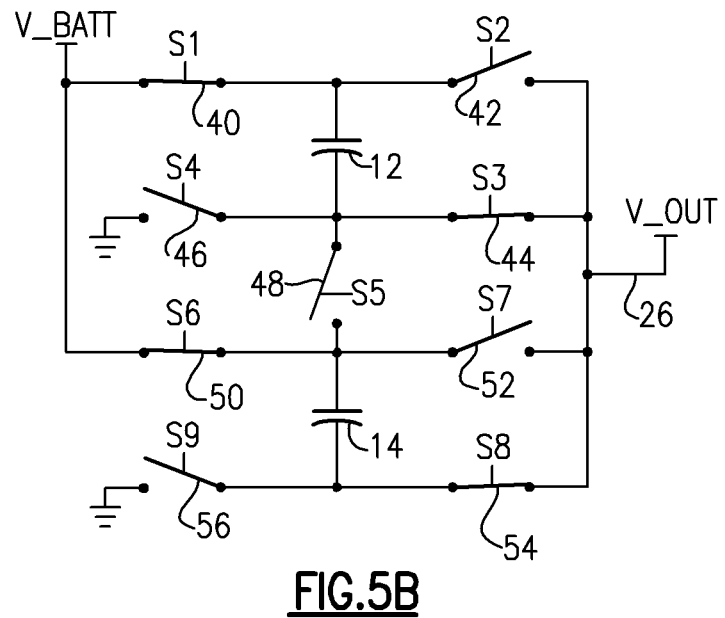
FIG. 5B is a circuit diagram illustrating the example switch matrix of FIG. 3A and FIG. 3B in a second phase configuration of the second mode configuration.

As illustrated in FIGS. 5A-B, in a second configuration, the switch matrix 16 can interconnect capacitors 12 and 14 in either the first phase configuration shown in FIG. 5A or the second phase configuration shown in FIG. 5B. This second configuration can be referred to herein as the "½A mode" because operation in this mode is intended to result in an output voltage signal V_OUT at output node 26 having a voltage level that is nominally or on average about one-half of the battery voltage V_BATT, according to some implementations. Also, as described below, there is a variant of the ½A mode, referred to as the ½B mode.

As shown in FIG. 5A, in the first phase configuration of the ½A mode, the switches 40, 44, 48, 50 and 54 are open, and the switches 42, 46, 52 and 56 are closed. The combination of the closed states of switches 42 and 46 couples capacitor 12 between ground and output node 26. The combination of the closed states of switches 52 and 56 similarly couples capacitor 14 between ground and output node 26 (i.e., in parallel with capacitor 12). Thus, in the first phase configuration of the ½A mode, the capacitor circuit including capacitors 12 and 14 in parallel discharges with respect to output node 26.

As shown in FIG. 5B, in the second phase configuration of the ½A mode, the switches 42, 46, 48, 52 and 56 are open, and the switches 40, 44, 50 and 54 are closed. The combination of the closed states of switches 40 and 44 couples capacitor 12 between the battery voltage and output node 26. The combination of the closed states of switches 50 and 54 similarly couples capacitor 14 between the battery voltage and output node 26 (i.e., in parallel with capacitor 12). Thus, in the second phase configuration of the ½A mode, the capacitor circuit including capacitors 12 and 14 in parallel with each other charges with respect to output node 26.

Figure 6A:
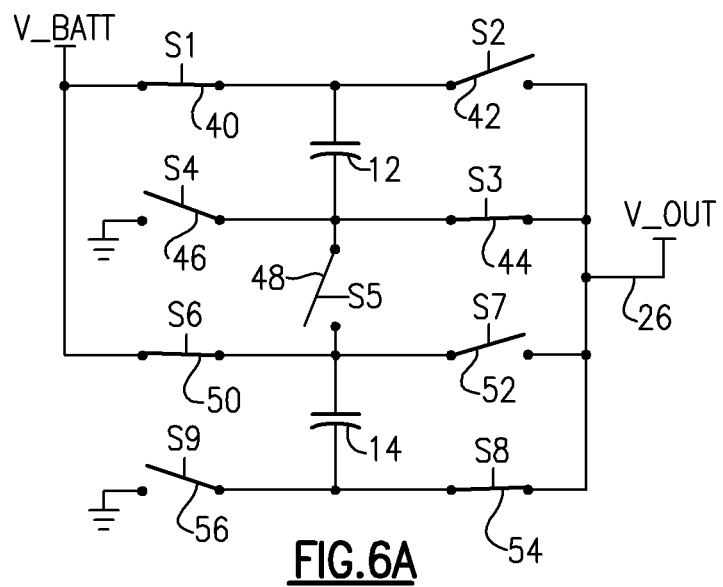
FIG. 6A is a circuit diagram illustrating the example switch matrix of FIG. 3A and FIG. 3B in a first phase configuration of a variant of the second mode configuration.
Figure 6B:
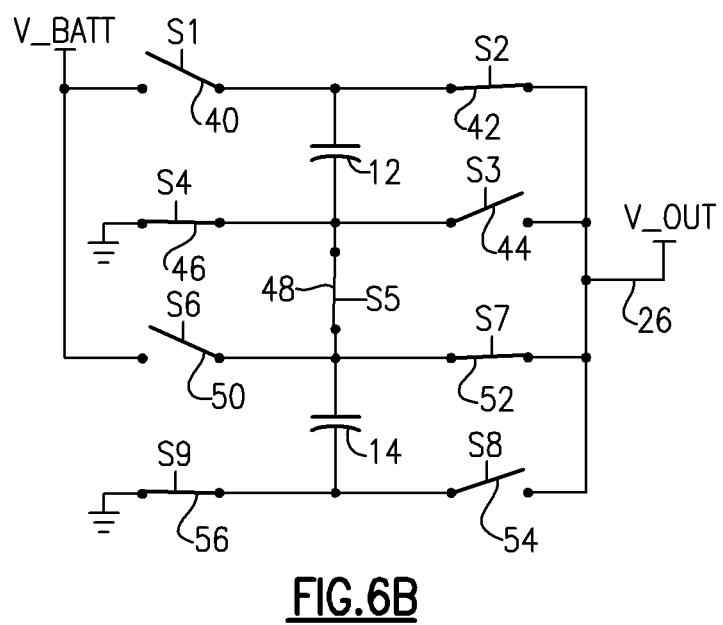
FIG. 6B is a circuit diagram illustrating the example switch matrix of FIG. 3A and FIG. 3B in a second phase configuration of the variant of the second mode configuration.

The ½B mode variant of the second mode configuration is shown in FIGS. 6A-B. The second mode configuration includes both the ½A and ½B modes, or sub-modes, to minimize the number of switches that change state during switching from one mode to another, as described below. Although these sub-modes are included in the illustrative embodiment, in other embodiments such sub-modes need not be included.

As shown in FIG. 6A, in the first phase configuration of the ½B mode, the switches 42, 46, 48, 52 and 56 are open, and the switches 40, 44, 50 and 54 are closed. The combination of the closed states of switches 40 and 44 couples capacitor 12 between the battery voltage and output node 26. The combination of the closed states of switches 50 and 54 similarly couples capacitor 14 between the battery voltage and output node 26 (i.e., in parallel with capacitor 12). Thus, in the second phase configuration of the ½B mode, the capacitor circuit including capacitors 12 and 14 in parallel charge with respect to output node 26.

As shown in FIG. 6B, in the second phase configuration of the ½B mode, the switches 40, 44, 48, 50 and 54 are open, and the switches 42, 46, 52 and 56 are closed. The combination of the closed states of switches 42 and 46 couples capacitor 12 between ground and output node 26. The combination of the closed states of switches 52 and 56 similarly couples capacitor 14 between ground and output node 26 (i.e., in parallel with capacitor 12). Thus, in the second phase configuration of the ½B mode, the capacitor circuit including capacitors 12 and 14 in parallel with each other discharges with respect to output node 26.

Figure 7A:
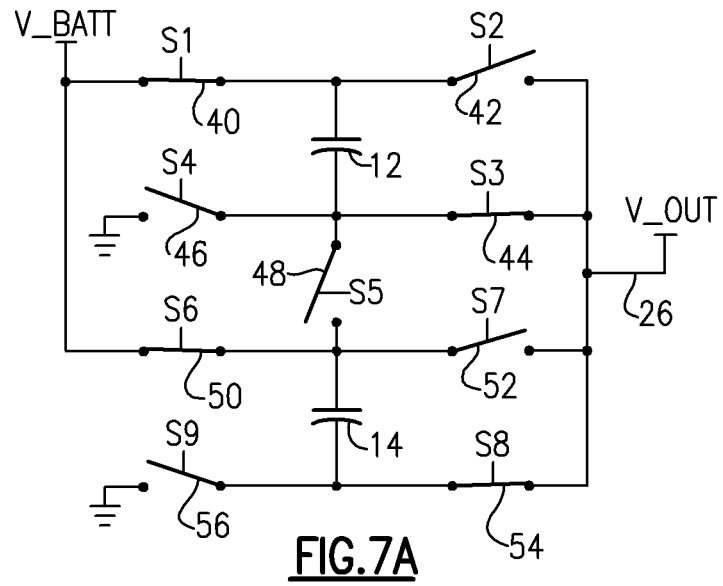
FIG. 7A is a circuit diagram illustrating the example switch matrix of FIG. 3A and FIG. 3B in a first phase configuration of a third mode configuration.
Figure 7B:
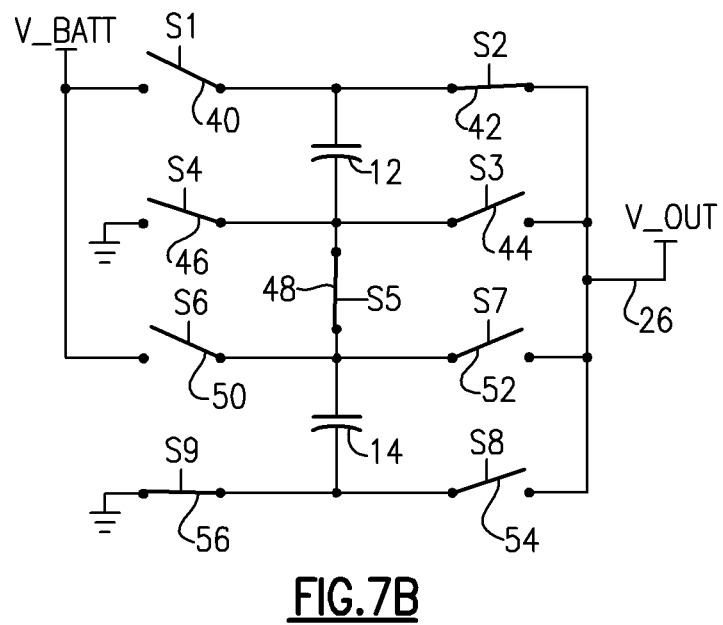
FIG. 7B is a circuit diagram illustrating the example switch matrix of FIG. 3A and FIG. 3B in a second phase configuration of the third mode configuration.

As illustrated in FIGS. 7A-B, in a third configuration, the switch matrix 16 can interconnect capacitors 12 and 14 in either the first phase configuration shown in FIG. 5A or the second phase configuration shown in FIG. 5B. This third configuration can be referred to herein as the "⅔ mode" because operation in this mode is intended to result in an output voltage signal at output node 26 having a voltage level that is nominally about two-thirds of the battery voltage V_BATT, according to some implementations.

As shown in FIG. 7A, in the first phase configuration of the ⅔ mode, the switches 42, 46, 48, 52 and 56 are open, and the switches 40, 44, 50 and 54 are closed. The combination of the closed states of switches 40 and 44 couples capacitor 12 between the battery voltage and output node 26. The combination of the closed states of switches 50 and 54 similarly couples capacitor 14 between the battery voltage and output node 26 (i.e., in parallel with capacitor 12). Thus, in the first phase configuration of the ⅔ mode, the capacitor circuit including capacitors 12 and 14 in parallel with each other charges with respect to output node 26.

As shown in FIG. 7B, in the second phase configuration of the ⅔ mode, the switches 40, 44, 46, 50, 52 and 54 are open, and the switches 42, 48 and 56 are closed. The combination of the closed states of switches 42, 48 and 56 couples capacitors 12 and 14 in series between ground and output node 26. Thus, in the second phase configuration of the ⅔ mode, the capacitor circuit including capacitors 12 and 14 in series with each other discharges with respect to output node 26.

Figure 8A:
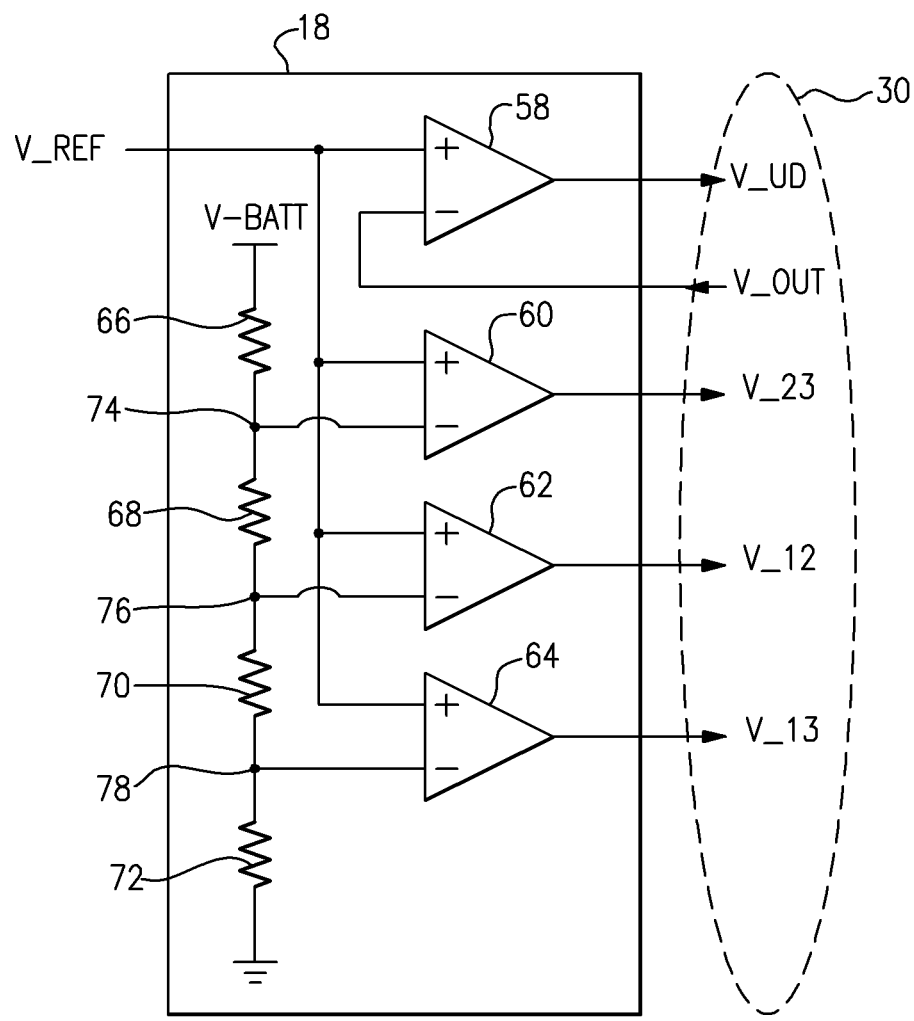
FIG. 8A is a circuit diagram of an example comparator circuit of FIG. 3A and FIG. 3B.

As illustrated in FIG. 8A, the comparator circuit 18 can include four comparators 58, 60, 62 and 64 and a voltage level generator including four resistors 66, 68, 70 and 72. The resistors 66, 68, 70, and 72 can be connected in series with each other between a supply voltage, such as the battery voltage, and ground. The values of resistors 66, 68, 70, and 72 can be selected such that the voltage at a node 74 at a first input of comparator 60 (e.g., the inverting input) is approximately ⅔ of the supply voltage V_BATT, the voltage at a node 76 at a first input of comparator 62 is approximately ½ of supply voltage V_BATT, and the voltage at a node 78 at a first input of comparator 64 is approximately ⅓ of supply voltage V_BATT. The second input (e.g., the non-inverting input) of each of comparators 60, 62 and 64 can be coupled to the reference voltage signal V_REF. In other implementations, the voltage level generator can generate any suitable voltage levels, for example, via a resistive voltage divider.

The reference voltage signal V_REF can be an analog baseband signal. In some instances, the reference voltage signal V_REF can track an output power of a power amplifier, such as the power amplifiers 5 described earlier. The reference voltage signal V_REF can be independent of a power supply signal, such as the battery voltage V_BATT. The reference voltage signal V_REF can be a clean signal with relatively little noise. For instance, in some implementations, noise features can distort the reference voltage signal V_REF by no more than about 0.01% to 0.5% of the magnitude of the reference voltage signal V_REF. In some implementations, noise features can distort the reference voltage signal V_REF by no more than about 0.05% of the magnitude of the reference voltage signal V_REF, no more than about 0.1% of the magnitude of the reference voltage signal V_REF, no more than about 0.25% of the magnitude of the reference voltage signal V_REF, or no more than about 0.5% of the magnitude of the reference voltage signal V_REF. In some embodiments, a bypass capacitor (for example, as described earlier) can reduce noise and/or maintain a low level of noise on the reference voltage signal V_REF. Using the reference voltage signal V_REF can avoid situations in which the mode can get trapped due to jitter associated with a signal provided to a comparator. The output voltage V_OUT can charge with the battery voltage V_BATT while the reference voltage signal V_REF is independent of the battery voltage V_BATT. Moreover, basing a comparison of the comparator circuit 18 on the reference voltage signal V_REF can increase the speed at which the output voltage V_OUT is charged up. In various implementations, the reference voltage signal V_REF can be filtered prior to being provided to the input of any combination of the comparators 58, 60, 62, and 64.

The output V_23 of the comparator 60 being high can indicate that the reference voltage V_REF exceeds (e.g., is greater in magnitude than) ⅔ V_BATT, the output V_12 of the comparator 62 being high can indicate that the reference voltage V_REF exceeds ½ V_BATT; and the output V_13 of the comparator 64 being high can indicate that the reference voltage V_REF exceeds ⅓ V_BATT. One input of comparator 58 (e.g., the inverting input) can be connected to the output voltage signal V_OUT at the output node 26. However, the other input of the comparator 58 (e.g., the non-inverting input) can be connected to the reference voltage signal V_REF. Thus, the output V_UD of the comparator 58 being high can indicate that the reference voltage V_REF exceeds the output voltage V_OUT. Conversely, the output V_UD of comparator 58 being low can indicate that the output voltage V_OUT exceeds the reference voltage V_REF. In some implementations, the output V_UD of the comparator 58 can serve as a direction comparison signal, indicating to switching logic 20 (FIGS. 3A and/or 3B) in which direction, "up" or "down," switching logic 20 should cause the output voltage signal V_OUT to change.

The outputs of one or more of the comparators 58, 60, 62, 64 can be provided to a switch matrix, such as the switch matrix 16 described earlier. In some implementations, the outputs of the comparators may be provided to the switch matrix 16 via one or more intervening circuit elements.

Figure 8B:
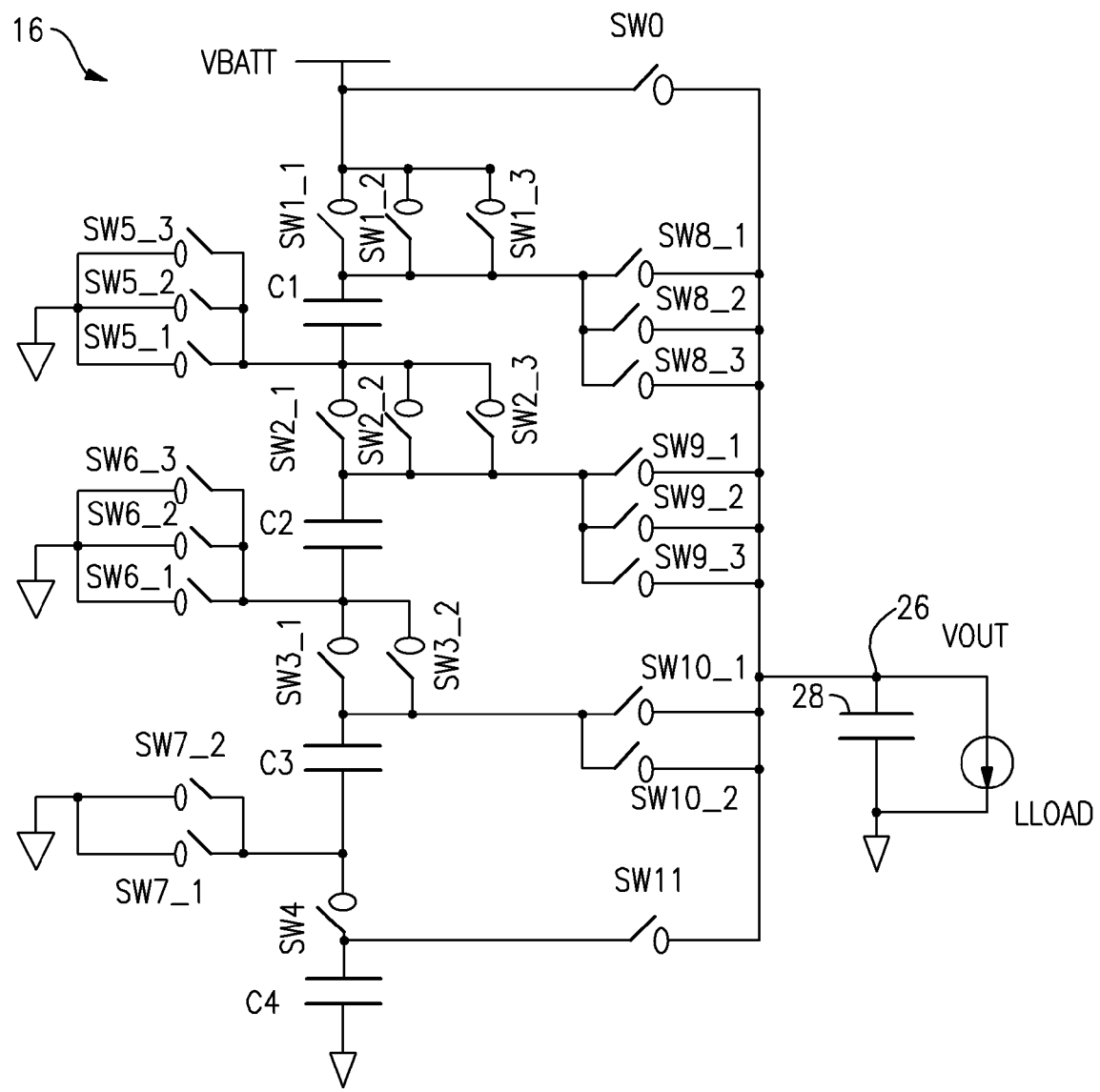
FIG. 8B shows another example switch matrix in combination with capacitive circuit elements.

Another example switch matrix in combination with capacitive circuit elements is shown in FIG. 8B. The switch matrix 16 illustrated in FIG. 8B can implement any combination of features of the switch matrices described herein. As shown in FIG. 8B, switches in a switch matrix 16 can be represented by two or more sub-switches in parallel and/or in series with each other. Each sub-switch can include a voltage controlled switch, for example, an NFET and/or a PFET device. The switch matrix 16 can be implemented with more than two capacitive circuit elements, such as capacitors. For instance, as illustrated in FIG. 8B, the switch matrix 16 can be implemented with four capacitors C1, C2, C3, and C4. The capacitors C1, C2, C3, and C4 can have approximately the same capacitance in some implementations. According to other implementations, two or more of the capacitors C1, C2, C3, and C4 can have different capacitances. One or more of the capacitors C1, C2, C3, and C4 can have a different capacitance than the capacitor 28.

In some implementations, one or more switches in the switch matrix can be implemented by a plurality of sub-switches in parallel. Each of the plurality of sub-switches can be controlled by a different input signal. For example, sub-switch sw1_1 can be controlled by output V_23 of the comparator 60, sub-switch sw1_2 can be controlled by the output V_12 of the comparator 62, and sub-switch sw1_3 can be controlled by the output V_13 of the comparator 64. As another example, sub-switch sw3_1 and sub-switch sw3_2 can be controlled by two different signals selected from V_23, V_12, and V_13. The switch sw4 can be considered to have only 1 sub-switch, which can be controlled by V_13, V_12, or V_23. As also illustrated in FIG. 8B, some switches can include different numbers of sub-switches (e.g., 1, 2, or 3 as illustrated) based on design considerations. While four comparators are shown in FIG. 8A, any suitable number of comparators can be included in order to achieve a desired level of granularity to control the switch matrix 16. For example, more comparators can be added to the comparator circuit 18 to generate additional control signals to achieve finer resolution for switch control over the range of voltage levels of the reference voltage signal V_REF. In some of these implementations, more than 3 sub-switches that are controlled by different control signals generated by the comparator circuit 18 may be provided for one or more switches of the switch matrix 16.

With the voltage level of the reference voltage signal V_REF changing, the output voltages of the comparators (e.g., V_23, V_12, and V_13) can be used to dynamically adjust the effective switch size of switches in the switch matrix 16 to improve and/or optimize efficiency at different voltage levels of the reference voltage signal V_REF. For example, at a relatively high voltage level of the reference voltage signal V_REF, all sub-switches in parallel can be turned on to lower the resistance of the switches in an on state. As another example, at a relatively low voltage level of the reference voltage signal V_REF, only a portion of the sub-switches in parallel with each other can be turned on to reduce dynamic switching current. Thus, an effective size of a switch, such as a filed effect transistor, in the switch matrix 16 can be adjusted based on current needed. As a result, less current can be consumed dynamically charging one or more capacitors, such as capacitors 12 and/or 14.

Switching frequency can also be controlled based on one or more outputs of the comparators 58, 60, 62, and 64. The effective resistance of the switched capacitor network can be proportional to the reciprocal of switching frequency times capacitance. More sub-switches in parallel can reduce the effective resistance and fewer sub-switches in parallel can increase effective resistance. Since dynamic power can be proportional to capacitance times voltage squared times frequency, adjusting the switching frequency can reduce power and/or enable selection of a switching frequency for efficiency with a particular voltage level of the reference voltage signal V_REF. This can achieve better efficiency for specific voltage levels of the reference voltage signal V_REF.

Figure 8C:
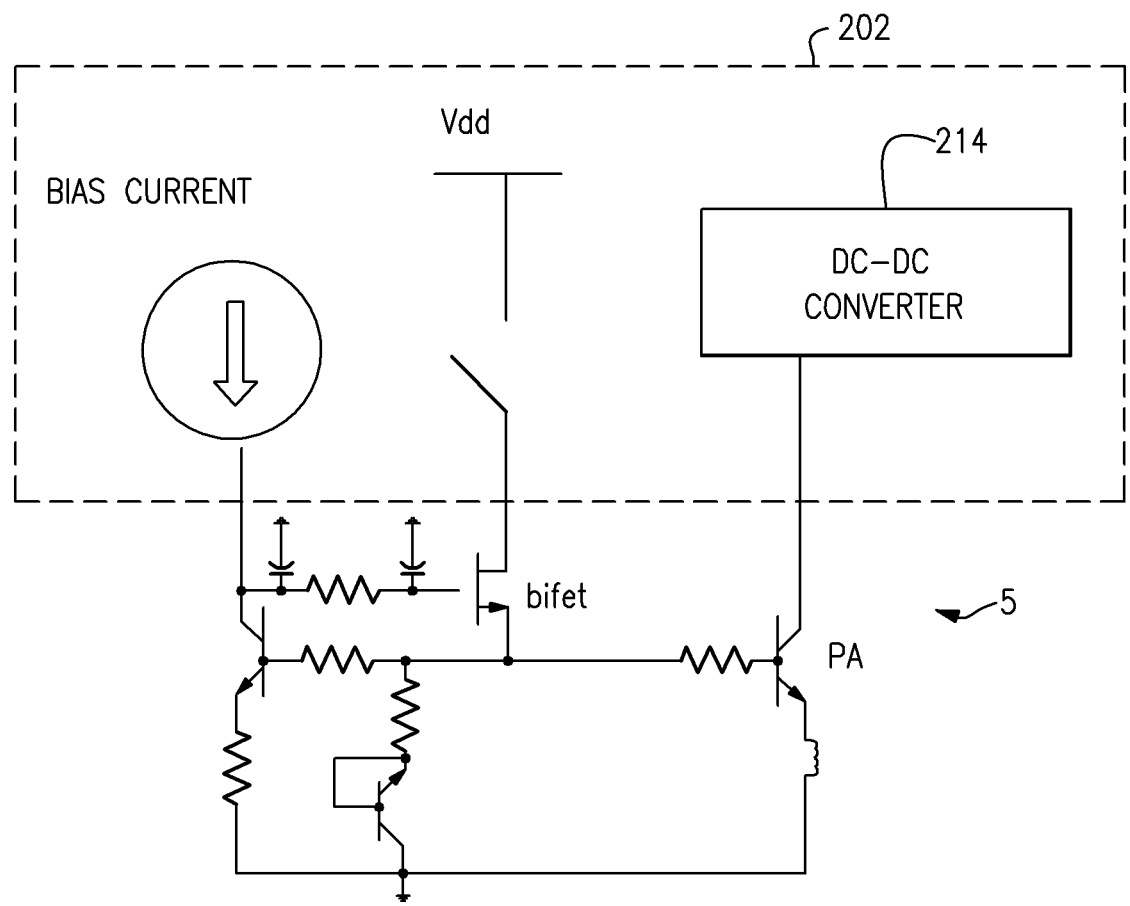
FIG. 8C illustrates an example schematic of a bias control circuit for a power amplifier.

FIG. 8C illustrates an example schematic of a bias control circuit for a power amplifier 5. The DC-DC voltage converter 214 of FIG. 8C can include any combination of features of the voltage converters described herein, such as the DC-DC voltage converter 10. One or more of the outputs from the comparator circuit 18, such as the comparators 60, 62, 64 of FIG. 8A, can be used to dynamically adjust bias current for a power amplifier 5 based on a voltage level of the reference voltage signal V_REF. Any suitable number of comparators can be included in the comparator circuit 18 of the control logic in order to achieve a desired level of resolution to control bias current of the power amplifier. For instance, more comparators can be included in the comparator circuit 18 to achieve finer resolution for the power amplifier bias control over the range of voltage levels of the reference voltage signal V_REF. This can further improve the power amplifier efficiency with adjacent channel power ratio (ACPR) margin. In some implementations, the bias current profile of the power amplifier 5 can track the voltage reference signal and/or the power amplifier power output level continuously, as well as the collector voltage of the power amplifier 5.

In some implementations, the mode selection logic 32 of the switching logic 20 (FIGS. 3A and/or 3B) can include combinational logic configured to determine the mode to which the switching logic 20 causes the switch matrix 16 to switch in order to cause the output voltage signal V_OUT to change in the direction indicated by the direction comparison signal, which can be generated by, for example, the comparator 58. The mode selection logic 32 can receive the comparison signals 30, which can be the outputs of the comparator circuit 18 (for example, outputs of the comparators 58-64) and/or based on the outputs of comparator circuit 18 (for example, based on outputs of the comparators 58-64). The comparison signals 30 can be provided as inputs to the combinational logic. The combinational logic can be provided in any suitable form, such as a network of logic gates. For illustrative purposes, the combinational logic will be described herein with reference to the table 80 shown in FIG. 9. It will be understood that there are a number of ways to implement the logic functions represented by the table 80 with a network of logic gates or any other suitable form. The mode selection logic 32 can output mode selection signals 36 (FIGS. 3A and/or 3B) in response to the comparison signals 30 and the combinational logic.

As illustrated in FIG. 9, Table 80 indicates the "next mode" (which can also be referred to as a "next state") to which switching logic 20 can cause the switch matrix 16 to switch in response to a combination of the outputs V_UD, V_23, V_12 and V_13 of comparators 58, 60, 62, and 64, respectively. The modes indicated in table 80 are described above: the ⅓ mode, the ½A mode, the ½B mode, and the ⅔ mode. Table 80 also indicates whether to "hold" the current mode, i.e., to maintain the current mode as the next mode. Specifically, the outputs of all of comparators 58-64 being low can indicate that the current mode is to be held in the (second phase configuration of the) ⅓ mode. In other instances, table 80 indicates that the mode is to switch. As described below, the mode can switch from the current mode to the next mode on every other clock cycle. It should be noted that a reference herein to "switching" or "changing" modes or to providing a mode control signal is intended to encompass within its scope of meaning not only changing to a different mode but also to maintaining the same mode at the time during which mode switching can occur, i.e., switching or changing from the current mode to the "next" mode in an instance in which both the current mode and next mode are the same.

The mode selection logic 32 (FIGS. 3A and/or 3B) can include encoding logic to encode some or all of the output, e.g., the next mode, and provide mode selection signals 36 in an encoded form. The encoding logic can encode the output in the form of, for example, a 3-bit word (MODE[2:0]). For example, the next mode output "⅓" can be encoded as "001"; the next mode output "½A" can be encoded as "010"; the next mode output "½B" can be encoded as "011"; and the next mode output "⅔" can be encoded as "100". As providing such encoding logic is well within the capabilities of persons skilled in the art, it is not shown or described in further detail herein.

Figure 10:
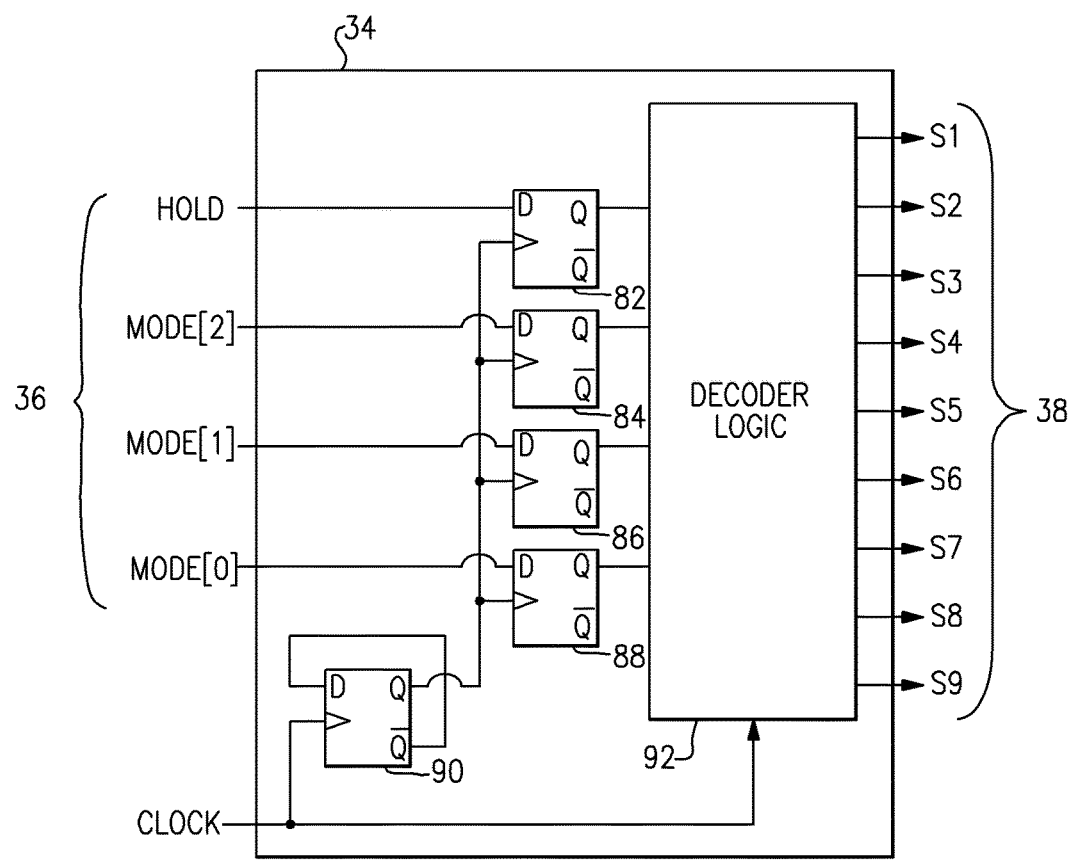
FIG. 10 is a circuit diagram illustrating example switch control logic shown in FIG. 3A and FIG. 3B.

As illustrated in FIG. 10, the switch control logic 34 can receive the mode selection signals 36, which may be in the above-described encoded form of a 3-bit word (MODE[2:0]) and the "hold" signal. The MODE[2:0] word and "hold" signal together can indicate the next mode to which switching logic 20 is to switch. The "hold" signal can be latched into a state element, such as a flip-flop 82, in the control logic 34. The MODE[2] bit can be latched into a state element, such as a flip-flop 84, in the control logic 34. The MODE[1] bit can be latched into a state element, such as a flip-flop 86, in the control logic 34. The MODE[0] bit can be latched into a state element, such as a flip-flop 88, in the control logic 34. The flip-flops 82-88 can latch their inputs, on every other cycle of the clock signal (CLOCK). Another flip-flop 90 can divide the clock signal by two and provide the divided clock signal to the clock inputs of flip-flops 82-88. Other state elements can be used instead of flip-flops, such as latches and the like.

The switch control logic 34 also includes decoder logic 92 coupled to the outputs of flip-flops 82-88. The decoder logic 92 can decode the latched MODE[2:0] word and "hold" signal into the individual switch control signals 38 (for example, S1-S9) that control the above-described switches 40-56 of the switch matrix 16 and/or any of the sub-switches in the switch matrix 16. While mode selection signals 36 can indicate the "next" mode, the latched MODE[2:0] word and "hold" signal can indicate the "current" mode. The decoder logic 92 can generate switch control signals 38 (for example, S1-S9) in response to the current mode and the clock signal.

The operation of some implementations of the decoder logic 92 is reflected in the circuit diagrams of FIGS. 4A-7B. It will be understood that for each mode configuration illustrated in FIGS. 4A-7B, the switches 40-56 assume the first phase configuration during one half of each clock cycle and assume the second phase configuration during the other half of each clock cycle. In response to the latched MODE [2:0] word indicating the ⅓ mode or "001," the decoder logic 92 can generate switch control signals 38 (for example, S1-S9) to set the switches 40-56 to the states shown in FIG. 4A during the first half of each clock cycle and to the states shown in FIG. 4B during the second half of each clock cycle. In response to the latched MODE[2:0] word indicating the ½A mode or "010," the decoder logic 92 can generate switch control signals 38 (for example, S1-S9) to set switches 40-56 to the states shown in FIG. 5A during the first half of each clock cycle and to the states shown in FIG. 5B during the second half of each clock cycle. In response to the latched MODE[2:0] word indicating the ½B mode or "011," the decoder logic 92 can generate switch control signals 38 (for example, S1-S9) to set switches 40-56 to the states shown in FIG. 6A during the first half of each clock cycle and to the states shown in FIG. 6B during the second half of each clock cycle. In response to the latched MODE[2:0] word indicating the ⅔ mode or "100," the decoder logic 92 can generate switch control signals 38 (for example, S1-S9) to set switches 40-56 to the states shown in FIG. 7A during the first half of each clock cycle and to the states shown in FIG. 7B during the second half of each clock cycle. In response to the latched "hold" signal indicating the "hold" mode, the decoder logic 92 can generate switch control signals 38 (S1-S9) to maintain switches 40-56 in their previous mode configurations during each half of the next clock cycle. It will be understood that any combination of the states described above can be implemented in the opposite halves of each clock cycle and/or for different portions/multiples of a clock cycle.

Figure 11:
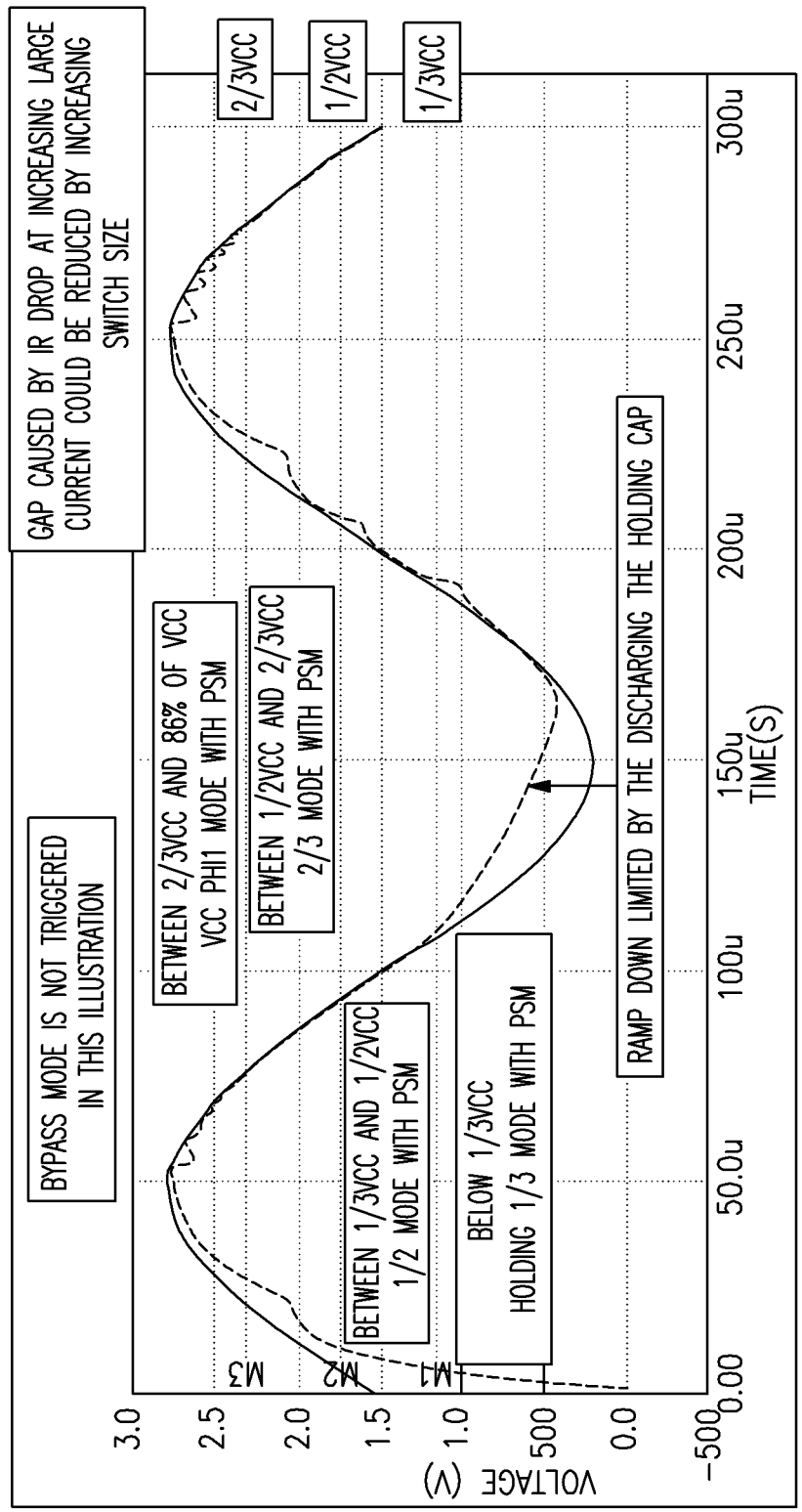
FIG. 11 is a timing diagram illustrating an example of operation of the voltage converter of FIG. 3A and FIG. 3B.
Figure 12:
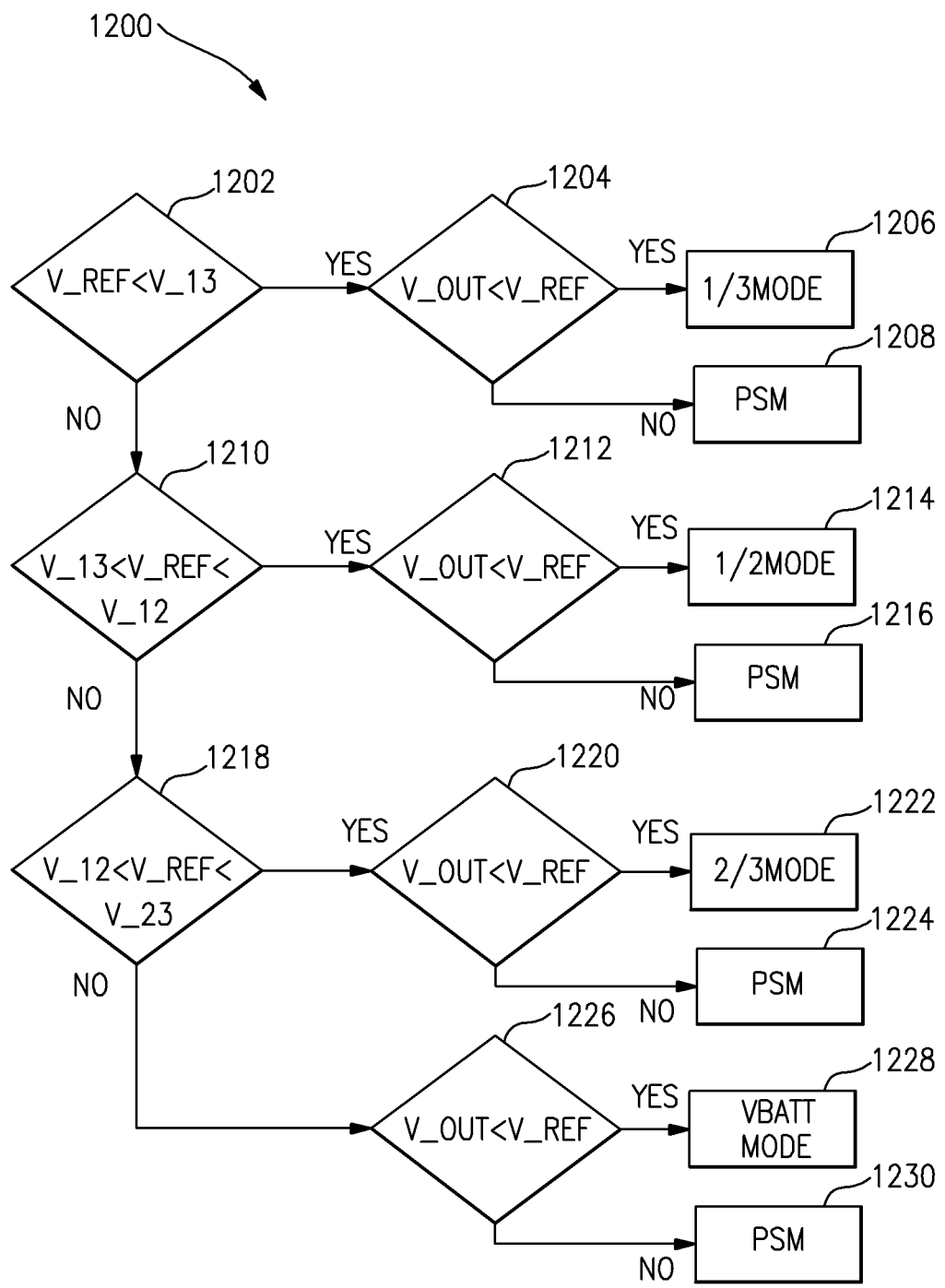
FIG. 12 is a flow diagram illustrating an example method of operation of the voltage converter of FIG. 3A and FIG. 3B.

FIGS. 11 and 12 illustrate example methods of toggling between different modes of operation in the DC-DC converters 214 described herein. Efficiency can be improved by stopping the clock in response to V_OUT crossing V_REF, thereby halting the switching network 16. While DC-DC converters corresponding to the graph shown in FIG. 11 and/or the flow diagram of FIG. 12 may include a specific number of modes for illustrative purposes, it will be understood that the principles and advantages described with reference to FIGS. 11 and/or 12 can be applied to a system with any suitable number of modes. Similarly, it will be understood that the threshold voltage levels (e.g., ⅓ Vcc, ½ Vcc, ⅔ Vcc) are also described for illustrative purposes, and any suitable voltage levels can be implemented with any combination of features described in reference to FIGS. 11 and/or 12.

FIG. 11 is a timing diagram illustrating an example operation of the DC-DC voltage converter 214 of FIGS. 3A and/or 3B. The timing diagram shows the reference voltage signal V_REF and the output voltage signal V_OUT in one embodiment. In FIG. 11, the voltage level of the output voltage signal V_OUT over time is represented by the dashed curve and the voltage level of the reference voltage signal V_REF over time is represented by the solid curve. As illustrated, the reference voltage signal V_REF is a relatively noise free signal. The output voltage signal V_OUT can track the reference voltage signal V_REF as the reference voltage signal V_REF changes via a DC-DC switched capacitor voltage converter. The Vcc voltage is provided by the battery in the graph shown in FIG. 11.

Depending on whether the output voltage signal V_OUT or the reference voltage signal V_REF has a higher voltage level, the DC-DC converter may operate in a pulse skipping mode (PSM). For example, when the reference voltage V_REF crosses ⅓ Vcc, the ⅓ mode may not be capable of increasing the output voltage V_OUT to be approximately equal to the reference voltage V_REF. As a result, the DC-DC converter 214 can switch to ½ mode. However, since the reference voltage V_REF may be just slightly higher than ⅓Vcc, when changing to ½ mode, V_OUT may overshoot the reference voltage V_REF and draw substantial current. This can degrade the efficiency of the DC-DC converter 214.

To address this problem, among others, the DC-DC converter 214 can operate in pulse skipping mode (PSM) and/or adjust effective switch size. In PSM mode, once the output voltage V_OUT passes the reference voltage V_REF (for example, V_OUT becomes greater than V_REF), the DC-DC converter 214 can turn-off an oscillator, let a load drain the current until the output voltage V_OUT becomes less than the reference voltage V_REF and restart the clock to charge the output voltage V_OUT. Adjusting the switch size can be implemented, for example, as shown and described with reference to FIG. 8B. For example, based on the load current when the output voltage V_OUT just passes the reference voltage V_REF, at least a portion of the sub-switches can be turned off to increase an effective resistance of one or more of the switches. This can also help offset the current overshoot drawing from a supply voltage, such as Vbatt. This can also further increase the power efficiency.

Referring back to FIG. 11, in some implementations, when the output voltage V_OUT is less than the reference voltage V_REF, the DC-DC converter 214 can operate in PSM mode. More specifically, while the reference voltage V_REF is below ⅓ Vcc, the mode control logic can keep the DC-DC converter 214 in the ⅓ mode when the output voltage V_OUT is less than the reference voltage V_REF. When the output voltage V_OUT is greater than the reference voltage V_REF, the DC-DC converter 214 can operate in the PSM mode instead of the ⅓ mode. When the reference voltage V_REF and the output voltage V_OUT are substantially equal, then the DC-DC converter 214 may operate in either mode, depending on the implementation. However, compare circuitry, such as the comparator circuitry 18, can determine small differences between the output voltage V_OUT and the reference voltage V_REF.

When the voltage level of the reference voltage signal V_REF exceeds ⅓ Vcc, the reference voltage V_OUT may not be able to exceed the reference voltage V_REF in ⅓ mode. As a result, the control logic 20 can toggle one or more switches in the switch matrix 16 such that the DC-DC converter 214 switches into the ½ mode. When V_REF is between ⅓ Vcc and ½ Vcc, the DC-DC converter 214 can remain in ½ mode when V_OUT is less than V_REF and transition to the PSM mode when V_OUT is greater than V_REF. Similarly, when V_REF is between ½ Vcc and ⅔ Vcc, the DC-DC converter 214 can operate in ⅔ mode when V_OUT is less than V_REF and operate in the PSM mode when V_OUT is greater than V_REF. Likewise, when V_REF is greater than ⅔ Vcc, the DC-DC converter 214 can operate in Phi1 mode or Vbatt mode when V_OUT is less than V_REF and operate in the PSM mode when V_OUT is greater than V_REF. Each time the voltage level of the output voltage V_OUT crosses the reference voltage signal V_REF, the control logic 20 can cause the DC-DC converter 214 to operate in the PSM mode. Modes can be adjusted by toggling one or more switches in the switch matrix 16 such that the DC-DC converter 214 adjusts the mode.

As also shown in FIG. 11, ramp down can be limited by discharging a holding capacitor. In some implementations, it can be desirable for the collector voltage of a power amplifier 5 that uses the DC-DC converter 214 for biasing to be more than about 0.7 V. In addition, gaps separating the reference voltage signal V_REF and the output voltage signal V_OUT can be reduced in some instances, by increasing switch size so as to reduce IR drops at increasing currents.

FIG. 12 is a flow diagram illustrating an example process 1200 of operating the DC-DC voltage converter 214 of FIGS. 3A and/or 3B. A voltage converter can operate in a mode, for example, any of the modes described herein based on outputs generated from comparisons in a compare circuit, such as the compare circuit 18. For instance, one or more comparisons performed by the comparators of FIG. 8A can be used to determine a mode in which the DC-DC voltage converter 214 can operate.

In some implementations, the DC-DC voltage converter 214 can operate in a ⅓ mode when a reference voltage signal V_REF is less than ⅓ of a supply voltage. For instance, when the comparison at block 1202 indicates that V_REF is less than ⅓ of the supply voltage and the comparison at block 1204 indicates that the output voltage V_OUT is less than the reference voltage V_REF, the DC-DC converter 214 can be set to ⅓ mode at block 1206.

The DC-DC voltage converter 214 can operate in a ½ mode when a reference voltage signal V_REF is greater than ⅓ of a supply voltage and less than ½ of the supply voltage. For instance, when the comparison at block 1210 indicates that V_REF is between ⅓ of the supply voltage and ½ of the supply voltage and the comparison at block 1212 indicates that the output voltage V_OUT is less than the reference voltage V_REF, the DC-DC converter 214 can be set to ½ mode at block 1214.

The DC-DC voltage converter 214 can operate in a ⅔ mode when a reference voltage signal V_REF is greater than ½ of a supply voltage and less than ⅔ of the supply voltage. For instance, when the comparison at block 1218 indicates that V_REF is between ½ of the supply voltage and ⅔ of the supply voltage and the comparison at block 1220 indicates that the output voltage V_OUT is less than the reference voltage V_REF, then the DC-DC converter 214 can be set to ⅔ mode at block 1222.

The DC-DC voltage converter can operate in a supply mode when a reference voltage signal V_REF is greater than ⅔ of a supply voltage. For instance, when the comparison at block 1218 indicates that V_REF is between more than ⅔ of the supply voltage and the comparison at block 1226 indicates that the output voltage V_OUT is less than the reference voltage V_REF, then the DC-DC converter 214 can be set to Vbatt mode at block 1228.

Based on one or more comparisons in the compare circuit 18, the DC-DC converter 214 can also operate in PSM mode. For example, when the output voltage V_OUT is greater than the reference voltage V_REF, the DC-DC converter 214 can operate in a PSM mode. For example, based on the comparisons at blocks 1204, 1212, 1220, or 1226, the DC-DC converter 214 can be set to pulse skipping mode at blocks 1208, 1216, 1224, or 1230, respectively.

In some implementations, the DC-DC converter 214 may switch to bypass mode in response to the reference voltage V_REF reaching a certain percentage of Vcc. For example, as shown in FIG. 12, when the reference voltage V_REF reaches ⅔ Vcc, the DC-DC converter 214 can operate in Vbatt mode. The operations in FIG. 12 can be implemented concurrently, sequentially, or in any order, as appropriate.

Applications

Some of the embodiments described above have provided examples in connection with wireless devices, such as mobile phones, that include power amplifiers. However, the principles and advantages of the embodiments can be used for any other systems or apparatus that has a need for DC-DC voltage conversion.

Such systems with DC-DC converters can be implemented in various electronic devices. Examples of electronic devices can include, but are not limited to, consumer electronic products, parts of the consumer electronic products, electronic test equipment, etc. The consumer electronic products can include, but are not limited to, a mobile phone (e.g., a smart phone), a telephone, a television, a computer monitor, a computer, a hand-held computer, a tablet computer, a laptop computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Part of the consumer electronic products can include a multi-chip module, a power amplifier module, an integrated circuit including a DC-DC converter, etc. Moreover, other examples of the electronic devices can also include, but are not limited to, memory chips, memory modules, circuits of optical networks or other communication networks, and disk driver circuits. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements.

Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having acts, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms, furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
    a power amplifier on a gallium arsenide die, the power amplifier configured to amplify a radio frequency signal; and
    a direct current to direct current voltage converter configured to provide a bias voltage to the power amplifier, the direct current to direct current voltage converter including capacitors, a switch matrix configured to electrically connect the capacitors differently between a supply voltage and an output node in different modes based on a control signal, and control logic configured to generate the control signal based on a comparison of a voltage associated with at least one of the different modes with a reference voltage.

2. The power amplifier system of claim 1 wherein the power amplifier includes a bipolar transistor and a collector of the bipolar transistor is configured to receive the bias voltage.

3. The power amplifier system of claim 1 further comprising a bias control circuit configured to provide a bias current to the power amplifier, the bias control circuit configured to dynamically adjust the bias current based on the comparison.

4. The power amplifier system of claim 1 wherein the direct current to direct current voltage converter is configured to adjust an effective switch size of a switch of the switch matrix based on the comparison.

5. The power amplifier system of claim 1 wherein the direct current to direct current voltage converter is configured to operate in a pulse skipping mode.

6. The power amplifier system of claim 1 wherein the different modes include at least three modes.

7. The power amplifier system of claim 1 wherein the control logic includes comparators configured to compare the reference voltage with voltages associated with at least two of the different modes and to generate the control signal based on outputs of the comparators.

8. A power amplifier system comprising:
    a power amplifier configured to amplify a radio frequency signal; and
    a direct current to direct current voltage converter having a division ratio and including control logic configured to perform comparisons to compare voltages associated with different modes of the direct current to direct current voltage converter with a voltage associated with an output power level of the power amplifier, the direct current to direct current voltage converter configured to adjust the division ratio based on at least one of the comparisons and to provide a bias voltage to the power amplifier.

9. The power amplifier system of claim 8 further comprising a bias control circuit configured to provide a bias current to the power amplifier, the bias control circuit configured to dynamically adjust the bias current based on at least one of the comparisons.

10. The power amplifier system of claim 9 wherein the bias control circuit is configured to provide the bias current such that the bias current continuously tracks the output power level of the power amplifier.

11. The power amplifier system of claim 8 wherein the power amplifier is on a gallium arsenide die.

12. The power amplifier system of claim 11 wherein the direct current to direct current voltage converter is configured to adjust an effective switch size of at least one switch of the switch matrix based on at least one of the comparisons.

13. The power amplifier system of claim 11 wherein the direct current to direct current voltage converter is configured to adjust a switching frequency of at least one switch of the switch matrix based on at least one of the comparisons.

14. The power amplifier system of claim 8 wherein the power amplifier includes a bipolar transistor and a collector of the bipolar transistor is configured to receive the bias voltage.

15. The power amplifier system of claim 8 wherein the voltage associated with the output power level of the power amplifier is a reference voltage that is independent of a supply voltage provided to the direct current to direct current voltage converter.

16. The power amplifier system of claim 8 wherein noise on the voltage associated with the output power level of the power amplifier is at least an order of magnitude less than noise on the bias voltage.

17. The power amplifier system of claim 8 wherein noise on the voltage associated with the output power level of the power amplifier is less than 0.5% of a magnitude of the voltage associated with the output power level of the power amplifier.

18. A mobile device comprising:
   a power amplifier configured to amplify a radio frequency signal;
   an antenna operatively coupled to an output of the power amplifier;
   a direct current to direct current voltage converter including capacitors, a switch matrix configured to electrically connect the capacitors differently between a supply voltage and an output node in different modes based on a control signal, and control logic configured to perform comparisons to compare voltages associated with different modes of the direct current to direct current voltage converter with a voltage associated with an output power of the power amplifier, and the direct current to direct current voltage converter configured to adjust its division ratio based on the comparisons and to provide a bias voltage to the power amplifier; and
   a battery configured to provide the supply voltage to the direct current to direct current voltage converter.

19. The mobile device of claim 18 configured as a cellular phone.

20. The mobile device of claim 18 further comprising a bias control circuit configured to provide a bias current to the power amplifier, the bias control circuit configured to dynamically adjust the bias current based on at least one of the comparisons.

* * * * *